United States Patent
Radovanovic et al.

(10) Patent No.: US 9,676,996 B2
(45) Date of Patent: Jun. 13, 2017

(54) LIGHT EMITTING MATERIAL AND METHOD FOR PRODUCTION THEREOF

(71) Applicants: Pavle Radovanovic, Waterloo (CA); Ting Wang, Waterloo (CA)

(72) Inventors: Pavle Radovanovic, Waterloo (CA); Ting Wang, Waterloo (CA)

( * ) Notice: Subject to any disclaimer, the term of this patent is extended or adjusted under 35 U.S.C. 154(b) by 55 days.

(21) Appl. No.: 14/398,519

(22) PCT Filed: May 7, 2013

(86) PCT No.: PCT/CA2013/050353
§ 371 (c)(1),
(2) Date: Nov. 3, 2014

(87) PCT Pub. No.: WO2013/166601
PCT Pub. Date: Nov. 14, 2013

(65) Prior Publication Data
US 2015/0108406 A1    Apr. 23, 2015

Related U.S. Application Data

(60) Provisional application No. 61/643,736, filed on May 7, 2012.

(51) Int. Cl.
*C09K 11/08* (2006.01)
*H01L 33/50* (2010.01)
(Continued)

(52) U.S. Cl.
CPC .............. *C09K 11/06* (2013.01); *C09K 11/54* (2013.01); *C09K 11/621* (2013.01);
(Continued)

(58) Field of Classification Search
CPC ......... C09K 11/06; C09K 11/54; C09K 11/62; C09K 11/64
See application file for complete search history.

(56) References Cited

U.S. PATENT DOCUMENTS

| 3,510,732 A | 5/1970 | Amans |
| 5,966,393 A | 10/1999 | Hide et al. |

(Continued)

FOREIGN PATENT DOCUMENTS

| DE | 102007049005 | 3/2009 |
| GB | 2301833 | * 12/1996 |

(Continued)

OTHER PUBLICATIONS

Joen et al, "Controlled fluoresnce Ronsance Energy Transfer Between ZnO Nanoparticles and Fluorohores in Layer-by-Layer Assembles", Hourn. Nonaosci and NanoTech., vol. 10, No. 10, Oct. 2010, p. 6819-6824.*

(Continued)

*Primary Examiner* — Carol M Koslow
(74) *Attorney, Agent, or Firm* — Gowling WLG (Canada) LLP; Neil Henderson

(57) ABSTRACT

A method of synthesizing a hybrid nanomaterial substrate for use in a light emitting structure is provided comprising the steps of: (a) defining one or more light emission characteristics for the light emitting structure; (b) selecting a nanocrystal and a compatible light emitting molecule; and (c) based on the light emission characteristics synthesizing a hybrid nanomaterial substrate by selectively varying the size of the nanocrystals in the substrate, and selectively bonding the light emitting molecules to surfaces of the nanocrystals, thereby synthesizing a nanomaterial structure that is operable to define a single illuminating entity operable upon application of a single excitation energy value to generate light emissions consistent with the light emission characteristics. A novel hybrid nanomaterial is also provided consisting of a nanocrystal-luminescent molecule structure defining a single illuminating entity with light emission affecting structural characteristics that vary across surfaces (Continued)

defined by the nanocrystals based on (a) selective variability of the size of the nanocrystals; and (b) selective variability across the substrate of the concentration of the luminescent molecule bonded to surfaces of the nanocrystals. Upon application to for example a diode comprising the hybrid nanomaterial of a single excitation energy value, the hybrid nanomaterial substrate converts the energy value into light emissions that across the variable substrate generates light emissions in white light range. The hybrid nanomaterial is tunable to achieve desired light emitting characteristics of the light emitting structure.

20 Claims, 50 Drawing Sheets

(51) Int. Cl.
    *C09K 11/06* (2006.01)
    *C09K 11/54* (2006.01)
    *C09K 11/62* (2006.01)
    *C09K 11/64* (2006.01)

(52) U.S. Cl.
    CPC .......... *C09K 11/641* (2013.01); *H01L 33/504* (2013.01); *C09K 2211/1018* (2013.01); *H01L 2933/0041* (2013.01)

(56) References Cited

U.S. PATENT DOCUMENTS

| | | | |
|---|---|---|---|
| 7,566,783 B2* | 7/2009 | Lakowicz | A61K 49/0019 424/9.6 |
| 8,309,375 B2 | 11/2012 | Shimizu et al. | |
| 2005/0253152 A1 | 11/2005 | Klimov | |
| 2008/0007156 A1 | 1/2008 | Gibson et al. | |
| 2010/0084629 A1 | 4/2010 | Park | |
| 2011/0057125 A1* | 3/2011 | Halpert | C09K 11/025 250/493.1 |

FOREIGN PATENT DOCUMENTS

| | | |
|---|---|---|
| WO | 2007078297 | 7/2007 |
| WO | 2010123809 | 10/2010 |
| WO | 2010123814 | 10/2010 |

OTHER PUBLICATIONS

European Patent Office, Extended European Search Report for European Patent App. No. 13787171.1, May 6, 2015.
Canadian Intellectual Property Office, International Search Report and Written Opinion for PCT Application No. PCT/CA2013/050353, dated Aug. 5, 2013.
European Patent Office, Office Action on European Patent Appln. No. 13787171.1, dated Feb. 9, 2017.

* cited by examiner

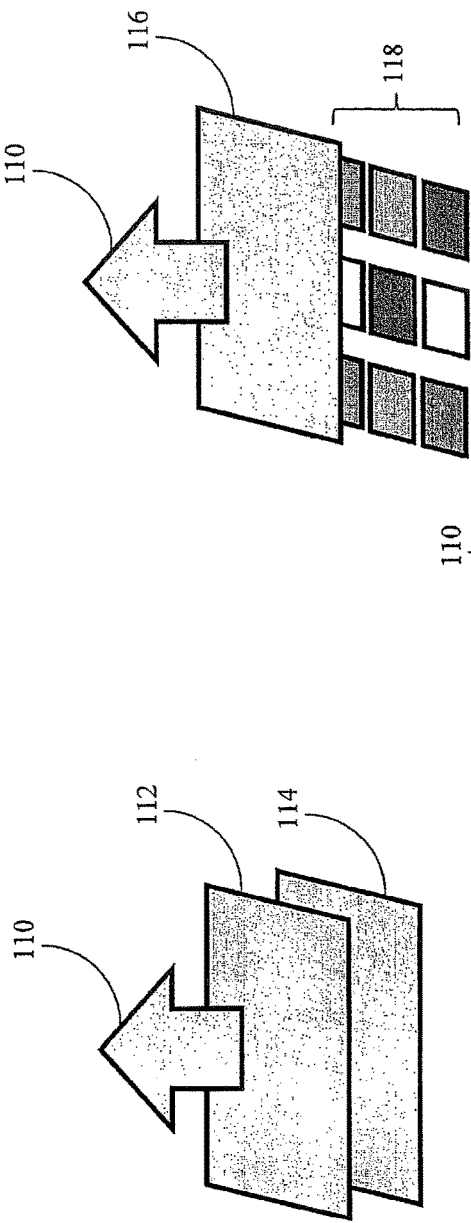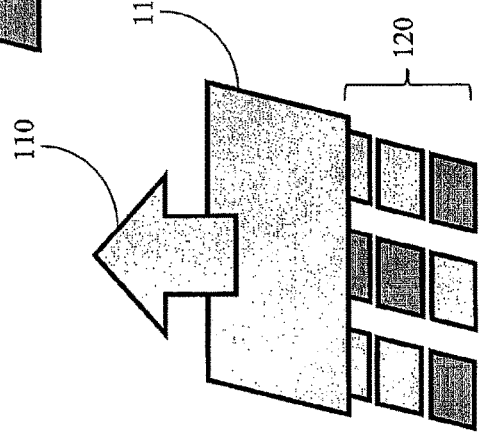

| RhB Concentration | CIE Coordinate (x,y,z) |
|---|---|
| 0.0 µM (Pure Ga2O3) | (0.2305,0.3116,0.4579) |
| 3.6 µM RhB | (0.2599,0.3285,0.4116) |
| 7.1 µM RhB | (0.2857,0.3417,0.3726) |
| 10.7 µM RhB | (0.3084,0.3529,0.3387) |
| 14.3 µM RhB | (0.3411,0.3681,0.2908) |
| 17.9 µM RhB | (0.3567,0.3744,0.2689) |
| 21.5 µM RhB | (0.3691,0.3809,0.2500) |
| 25.0 µM RhB | (0.3707,0.3812,0.2481) |
| 28.6 µM RhB | (0.3886,0.3883,0.2231) |
| Pure RhB | (0.5329,0.4658,0.0013) |

FIG. 6A

| RhB Concentration | CIE Coordinate (x,y,z) |
| --- | --- |
| 0.0 μM (Pure Ga$_2$O$_3$) | (0.2145, 0.2784, 0.5071) |
| 3.6 μM RhB | (0.3174, 0.3409, 0.3417) |
| 7.1 μM RhB | (0.3619, 0.3671, 0.2710) |
| 10.7 μM RhB | (0.3852, 0.3803, 0.2345) |
| 14.3 μM RhB | (0.40083, 0.3905, 0.2012) |
| 17.9 μM RhB | (0.4234, 0.4021, 0.1745) |
| 21.5 μM RhB | (0.4376, 0.4076, 0.1548) |
| 28.6 μM RhB | (0.4873, 0.4300, 0.0827) |
| Pure RhB | (0.5329, 0.4658, 0.0013) |

FIG. 8A

| RhB Concentration | CIE Coordinate (x,y,z) |
|---|---|
| 0.0 µM (Pure Ga$_2$O$_3$) | (0.2156, 0.3116, 0.4728) |
| 3.6 µM RhB | (0.2984, 0.3339, 0.3677) |
| 7.1 µM RhB | (0.3364, 0.3552, 0.3084) |
| 10.7 µM RhB | (0.3638, 0.3691, 0.2671) |
| 14.3 µM RhB | (0.3838, 0.3780, 0.2382) |
| 17.9 µM RhB | (0.4105, 0.3898, 0.1997) |
| 21.5 µM RhB | (0.4175, 0.3941, 0.1884) |
| 25.0 µM RhB | (0.4232, 0.3962, 0.1806) |
| 28.6 µM RhB | (0.4446, 0.4032, 0.1522) |
| Pure RhB | (0.5329, 0.4658, 0.0013) |

FIG. 10A

| RhB Concentration | CIE Coordinate (x,y,z) |
|---|---|
| 0.0 μM (Pure $Ga_2O_3$) | (0.2055, 0.2536, 0.5409) |
| 3.6 μM RhB | (0.2900, 0.3103, 0.3997) |
| 7.1 μM RhB | (0.3450, 0.3432, 0.3118) |
| 10.7 μM RhB | (0.3608, 0.3520, 0.2872) |
| 14.3 μM RhB | (0.3803, 0.3616, 0.2581) |
| 17.9 μM RhB | (0.4011, 0.3744, 0.2245) |
| 21.5 μM RhB | (0.4165, 0.3819, 0.2016) |
| 25.0 μM RhB | (0.4230, 0.3851, 0.1919) |
| 28.6 μM RhB | (0.4309, 0.3899, 0.1792) |
| Pure RhB | (0.5329, 0.4658, 0.0013) |

FIG. 12A

| Number | RhB Concentration | CIE Coordinate (x,y) |
|---|---|---|
| 1 | 0.0% RhB (Pure ZnO) | (0.219,0.308) |
| 2 | 10% RhB (Pure ZnO) | (0.266,0.378) |
| 3 | 20% RhB (Pure ZnO) | (0.278,0.381) |
| 4 | 30% RhB (Pure ZnO) | (0.290,0.387) |
| 5 | 40% RhB (Pure ZnO) | (0.305,0.396) |
| 6 | Pure RhB | (0.533,0.466) |

FIG. 16B

| RhB Concentration | CIE Coordinate (x,y) |
|---|---|
| 0.0% RhB (Pure ZnO) | (0.219, 0.308) |
| 10% RhB–ZnO | (0.266, 0.378) |
| 20% RhB–ZnO | (0.278, 0.381) |
| 30% RhB–ZnO | (0.290, 0.387) |
| 40% RhB–ZnO | (0.305, 0.396) |
| 50% RhB–ZnO | (0.315, 0.401) |
| 60% RhB–ZnO | (0.324, 0.406) |
| 70% RhB–ZnO | (0.335, 0.412) |
| 80% RhB–ZnO | (0.340, 0.415) |
| 90% RhB–ZnO | (0.352, 0.420) |
| 100% RhB–ZnO | (0.361, 0.427) |
| Pure RhB | (0.533, 0.466) |

FIG. 18A

LIGHT EMITTING MATERIAL AND METHOD FOR PRODUCTION THEREOF

FIELD

The present application relates to light emitting diodes (LEDs) and methods for production of LEDs.

BACKGROUND

Lighting buildings is estimated to require at least 20 percent of the global electricity consumption. At least in part because of this, the use of energy inefficient light bulbs, especially incandescent lighting, is typically being phased out legislatively and through promotion of more efficient lighting means.

Compact fluorescent light bulbs (CFLs) represent a more energy efficient alternative. However, CFLs are criticized for containing mercury, a very toxic and hazardous substance that could be released in home upon breakage. CFLs also face criticism that they do not generate the same white light tone as incandescent light bulbs, which may negatively impact consumer sentiment.

The use of LEDs is known for providing lighting systems with improved characteristics including: lower power consumption, extended lifetime, smaller size, and improved durability and reliability. LEDs generally use up to 90 percent less energy than traditional incandescent bulbs and can have a useful lifetime of up to 50,000 hours. LEDs also have important applications in other market segments, including auto industry, displays and TV backlights, for which the quality of illumination (brightness and color purity) is important, as is the cost and efficiency.

A further alternative may be Organic Light Emitting Diodes (OLEDs). OLEDs generally have simpler design than inorganic LEDs, but involve a complex synthesis procedure and contain expensive heavy or rare earth metals (platinum, iridium etc.). As well, organic or organometallic LEDs are generally less stable and less efficient than inorganic LEDs.

Light bulbs that use LEDs do not contain mercury and generally a much longer lifespan than the CFLs. The energy efficiency of a LED light bulb is superior to a traditional incandescent light bulb and at least as efficient, if not more so, than a CFL.

However, LED lighting sources and materials (such as, molecules or semiconductors) generally emit light in a narrow range of the visible spectrum, making the design of white light emitters very challenging and costly. Four conventional approaches for creating white light emitting diodes (LEDs) are described here.

In the first conventional approach, light emitting diodes with blue, green and red outputs have been combined in a light emitting structure to give an illusion of white light. There are several disadvantages to this approach, including the difficulty in making optimal green LEDs, and a very high design complexity and cost of manufacturing.

In the second conventional approach, white LEDs have been created by coating ultraviolet (UV) or blue LEDs (usually based on III-V semiconductors—gallium, gallium-indium or aluminum nitride) with one or more inorganic phosphors emitting complementary colors. If a blue LED is used, then a part of the emitted light is converted by using a phosphor material. Specifically, white LEDs have been created by blue LEDs with doped phosphors, such as Ce:YAG (cerium-doped yttrium aluminum garnet). In doped phosphors the dopant ions emit complementary colors to blue, for example yellow or orange, giving off quasi-white light upon illumination with a blue LED. In this approach it is difficult to find an appropriate dopant-host combination and to control the doping process in a reproducible way, generally resulting in low purity white light emissions. Furthermore, the difficulty of adjusting the fraction of LED emission which is absorbed by the phosphor to give off a white light appearance also contributes to lower quality of the obtained white light source. This approach generally requires the use of materials containing rare earth elements which are becoming increasingly scarce and expensive. As well, this method entails complex design requirements, and can result in lack of homogeneity (impurity) of white light illumination as a consequence of using multiple phosphors, or LEDs, and a single phosphor emission to produce white light.

In the third conventional approach, white LEDs have been created by using organic molecule-based electroluminescence. The most common approach within this strategy is coating an organic molecule-based blue electroluminescence device with multiple layers of organic molecules emitting different colors. This approach requires complex processing and generally results in large amounts of wasted organic material, resulting in relatively high fabrication cost.

In the fourth conventional approach, a blend of multiple organic molecule emitters is coated as a single layer in an electroluminescent device. This approach is more cost-effective, but results in low quality (impure) white light emission. Organic LEDs generally have a simpler design than inorganic LEDs, but involve complex synthetic procedures, and often also contain expensive heavy metals (platinum, iridium etc.) in case of organometallic emitters. Furthermore, organic LEDs are generally less stable than inorganic LEDs.

In general, the construction of white LEDs is challenging and costly because of the difficulties in obtaining multi-color emission in the necessary proportions.

There is therefore a need for an improved white light emitting material or LED and a method of synthesizing or fabricating white light emitting materials that overcomes at least some of the shortcomings of conventional LEDs and methods.

SUMMARY

In one aspect, a light emitting structure is provided that is configured such that a primary fluorophore has a first predetermined photoluminescence spectrum and a secondary fluorophore has a second predetermined photoluminescence spectrum and an absorption spectrum that overlaps with the first predetermined spectrum. The secondary fluorophore will be bound with the primary fluorophore such that nonradiative dipole-dipole coupling occurs. In one case, the primary fluorophore may consist of a metal oxide nanocrystal. The secondary fluorophore may be selected from a group that consists of: fluorescent dyes, polymers and quantum dots. In a further case, nonradiative dipole-dipole coupling is accomplished using Förster Resonance Energy Transfer (FRET).

In one case, the primary fluorophore and the secondary fluorophore are selected such that their emission spectra and absorption spectra interact to provide light emissions in the white light range. This selection may be accomplished by varying at least one of: the size of the primary fluorophore, the concentration of the secondary fluorophore bonded to the primary fluorophore, which impacts the average distance between the primary fluorophore and the secondary fluorophore, the type of secondary fluorophore, and the emission spectrum overlap between the primary fluorophore and the secondary fluorophore.

In another case, the secondary fluorophore is bound to the primary fluorophore by metal-binding functional groups. In a further case, the secondary fluorophore is indirectly bound or coupled to the primary fluorophore by a bonding agent or bar encapsulating the primary fluorophore and the secondary fluorophore using a nanoparticle such that the primary fluorophore and secondary fluorophore achieve the non-radiative dipole-dipole coupling.

According to another aspect herein, a method of synthesizing a light emitting structure is provided. In one case, the method consists of determining selected light emitting characteristics; selecting a primary fluorophore having a first predetermined photoluminescence spectrum, and a secondary fluorophore having a second predetermined photoluminescence spectrum and an absorption spectrum that overlaps with the first predetermined spectrum based on the selected light emitting characteristics; and binding the secondary fluorophore to the primary fluorophore such that nonradiative dipole-dipole coupling occurs in such a way that the selected light emitting characteristics are provided.

In one case, the selection of light emitting characteristics is accomplished by varying at least one of: the size of the primary fluorophore, the distance between the secondary fluorophore and the primary fluorophore, and the emission spectrum overlap between the secondary fluorophore and the primary fluorophore.

In a particular case, the selection of light emitting characteristics comprises light emissions being produced in the white light range.

In a further case, the binding of the primary and secondary fluorophores occurs in a liquid case. In another case, the binding comprises interactions of a functional group to provide a nanomaterial structure that is operable to define a single illuminating entity operable upon application of a single excitation energy to generate light emissions consistent with the light emission characteristics.

In another aspect, a method of synthesizing a light emitting structure is provided comprising: preparing a solution of a primary fluorophore; preparing a solution of a secondary fluorophore; and contacting the solutions such that the primary fluorophore and secondary fluorophore bind to provide nonradiative dipole-dipole coupling.

Other aspects and features of the present disclosure will become apparent to those ordinarily skilled in the art upon review of the following description of specific embodiments in conjunction with the accompanying figures. Also, it is to be understood that the phraseology and terminology employed herein are for the purpose of description and should not be regarded as limiting.

BRIEF DESCRIPTION OF THE DRAWINGS

Embodiments of the present disclosure will now be described, by way of example only, with reference to the attached Figures.

FIGS. 1A to 1E illustrate the general approaches, and the properties thereof, for forming LEDs.

FIGS. 2A to 2K illustrate certain parameters and characteristics of Förster resonance energy transfer, according to an embodiment.

FIGS. 6A and 6B illustrate the International Commission on Illumination (CIE) coordinates obtained from the photoluminescence spectra for gallium(III) oxide ($Ga_2O_3$) (approximately 5.6 nm)—Rhodamine B (RhB), according to an embodiment.

FIGS. 8A and 8B illustrate a map of $Ga_2O_3$ (approximately 4.4 nm)—RhB photoluminescence using a CIE chromaticity diagram, according to an embodiment.

FIGS. 10A and 10B illustrate $Ga_2O_3$ (approximately 4.3 nm)—RhB photoluminescence using a CIE chromaticity diagram, according to an embodiment.

FIGS. 12A and 12B illustrate CIE coordinate analyses of $Ga_2O_3$—RhB nanocomposites to achieve white light emissions, with 3.8 nm $Ga_2O_3$ nanocrystals with different amounts of RhB bound on the surface of the nanocrystals, according to an embodiment.

FIGS. 14A to 18B illustrate the parameters and characteristics of using a zinc oxide (ZnO) nanocrystal instead of using a $Ga_2O_3$ nanocrystal, according to an embodiment.

Figure 1D:
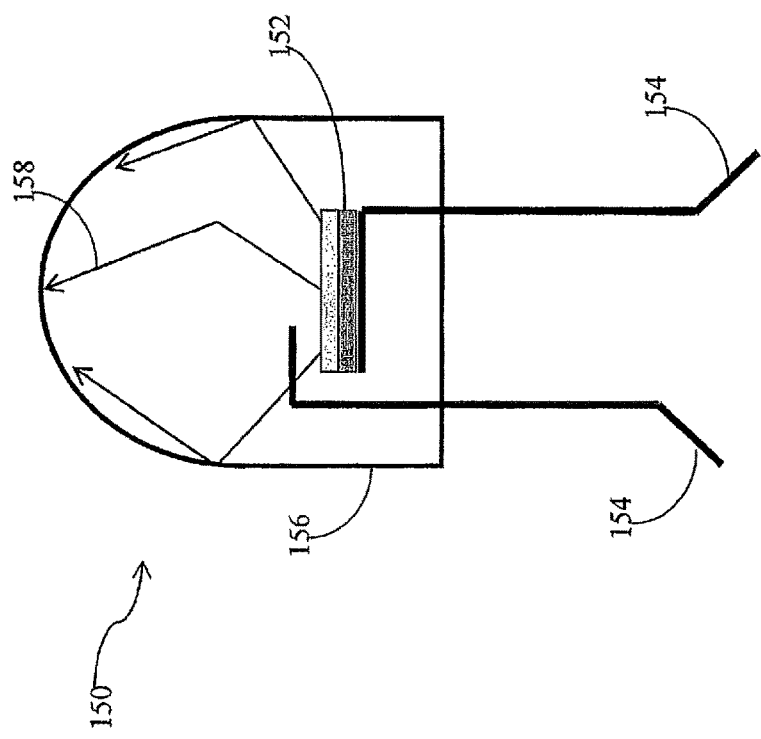

In the drawings, embodiments are illustrated by way of example. It is to be expressly understood that the description and drawings are only for the purpose of illustration and as an aid to understanding, and are not intended as a definition of the limits of the disclosure.

DETAILED DESCRIPTION

FIG. 1 illustrates the properties of a conventional white LED system. FIG. 1A illustrates a conventional phosphor-converted LED. A Blue or UV LED layer 114 is coated with a phosphor layer 112 in order to produce white light 110. FIG. 1B illustrates a conventional color-mixed LED. An array of multi-colored LEDs 118 is coated with color mixing optics 116 in order to produce white light 110. FIG. 1C illustrates a conventional hybrid method LED. An array of colored and phosphor-converted LEDs 120 is coated with color mixing optics 116 in order to produce white light 110.

Figure 1E:
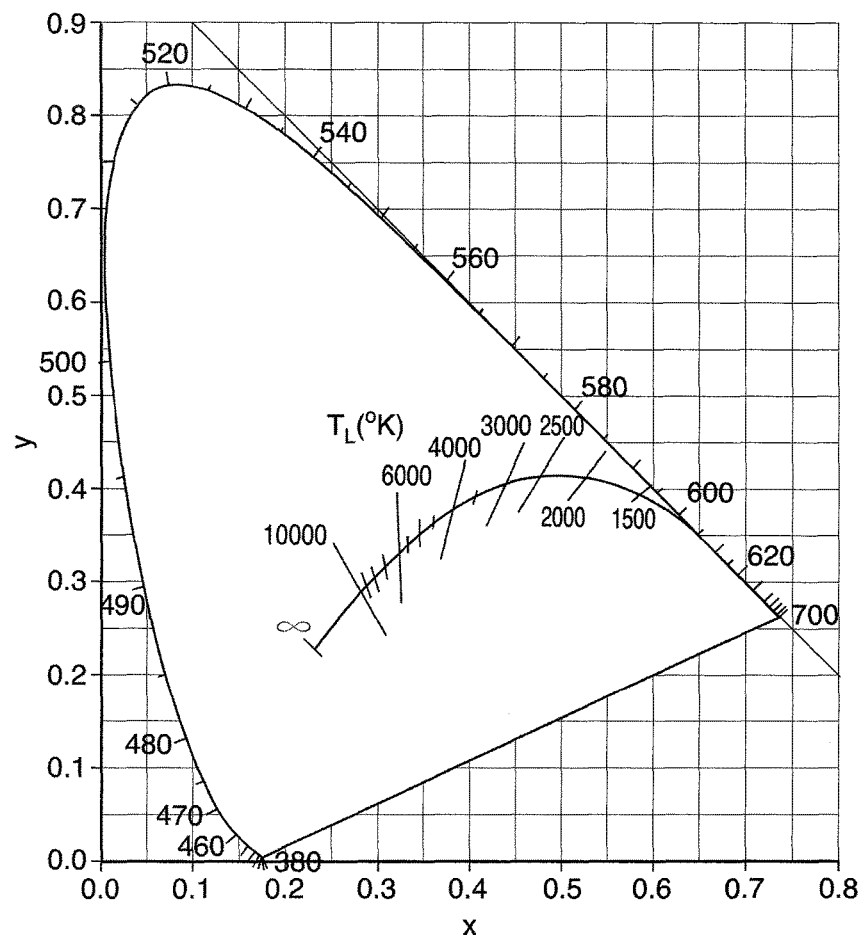

FIG. 1D illustrates a conventional LED device configuration 150. A layered diode 152 is located in between two terminal pins 154 inside a transparent plastic case 156. The terminal pins 154 protrude out the bottom of the transparent plastic case 156. When a voltage is applied across the terminal pins 154, the device emits light beams 158. FIG. 1E illustrates an example color space diagram for a conventional LED device.

In light of the complexity and the cost of conventional methods for fabricating white LEDs, the light emitting structures and production methods herein have been developed to provide hybrid materials and lighting systems that are intended to act as a single illumination entity (an artificial molecular fluorophore). Such hybrid materials include, as an example embodiment, transparent conducting oxide nanoparticles and an organic or organometallic complex that is bound to the surfaces of the oxide nanoparticles. This type of hybrid material can be made in a solid form or may be stored in a liquid form (for example as colloids), in order to simplify the fabrication of LEDs with different lighting characteristics.

White light emissions are generally induced by the combination of three primary colours (blue, green and red) or two complimentary colours (blue and orange or cyan and red). In one case, colloidal metastable $\gamma$-$Ga_2O_3$ nanocrystals emit light having a broad-band spectrum with a maximum that is size-tunable from the violet to cyan region (405-520 nm) of the visible spectrum. This emission arises from the recombination of an electron trapped on a donor (oxygen vacancy) with a hole trapped on an acceptor (gallium or gallium-oxygen vacancy pair). Known as the donor-acceptor pair (DAP) recombination, this phenomenon usually depends on the binding energy of localized donors and acceptors and their attractive Coulomb interaction. By manipulating the oxidative/reductive environment during the synthesis process, the native defect concentration can be controlled, in turn affecting the intensity of the defect emission.

A white light-emitting material may be made by adjusting the size of oxide nanocrystals, for example, by varying synthesis temperature, and by varying the concentration of RhB (or another fluorophore) on the nanocrystal surfaces. Varying the size of the nanocrystals may allow for tuning of the blue-green part of the spectrum, and varying the concentration of RhB bound to the nanocrystals can modulate the intensity of the orange/red part of the spectrum. A fluorophore such as RhB can be used because it satisfies the spectral requirements, is well characterized and readily commercially available.

An advantage of the embodiments described herein with regard to oxide nanocrystals is blue-to-green photoluminescence originating from donor-acceptor pair recombination, which is sufficiently broad and size-tunable in the exact spectral region so that it requires only a minor contribution to the emission from the orange-red part of the spectrum to generate white light. As a variety of the available organic dye molecules are highly emissive in the orange-red spectrum, hybrid materials based on colloidal $Ga_2O_3$ nanocrystals are a practicable way to obtain white light-emitting phosphors. Furthermore, the colloidal form of the nanocrystals allows for their easy manipulation and functionalization using chemical means, including the incorporation into LEDs.

An advantage of the synthesis method described herein is that it is intended to integrate non-radiative coupling of the chromophores. Non-radiative coupling is accomplished relying on Förster resonance energy transfer (FRET) effects for extending the blue emission in the red spectral region, thereby enabling white light formation based on excitation of the nanocrystals functionalized with RhB (or a similar molecule). FRET is an electrodynamic phenomenon that occurs between the donor in the excited state (i.e. blue emitting nanocrystals) and the acceptor in the ground state (i.e. RhB) through nonradiative dipole-dipole coupling between the two chromospheres. The extent to which energy is transferred from a donor to an acceptor is based on the overlap between the emission spectrum of a donor (blue emitting nanocrystals) and the absorption spectrum of an acceptor (RhB). As a result of the application of FRET, the nanocrystals provide not only a blue component of the spectrum but also a strong tunable overlap with the absorption of the molecular fluorophore. The blue luminescence of nanocrystals is sufficiently broad to allow for the white light formation upon the addition of a much narrower orange-red component from the adsorbed fluorophore. As well, it is believed that the application of FRET will significantly enhance the emission lifetime of the secondary chromophore (i.e. RhB).

By increasing the amount of the fluorophore-acceptor (for example RhB) on the surfaces of the nanocrystals, the probability of transferring energy from the donor (blue emitting nanocrystals) to the acceptor (RhB) increases. As a consequence the transferred energy may be higher than energy emitted in the form of blue luminescence, allowing for tuning of the white light from "cool" (i.e. bluer) to "warm" (i.e. "more yellow"). Accordingly, as further explained below, the synthesis of the hybrid nanocrystal may include a variation of the concentration of the fluorophore-acceptor. This variation is for the purpose of affecting energy transfer processes within the nanomaterial in order to tune the light emitting spectra of the nanomaterial in order to achieve overall white light luminescence that is consistent with a set of desired light emitting attributes.

Figure 2A:
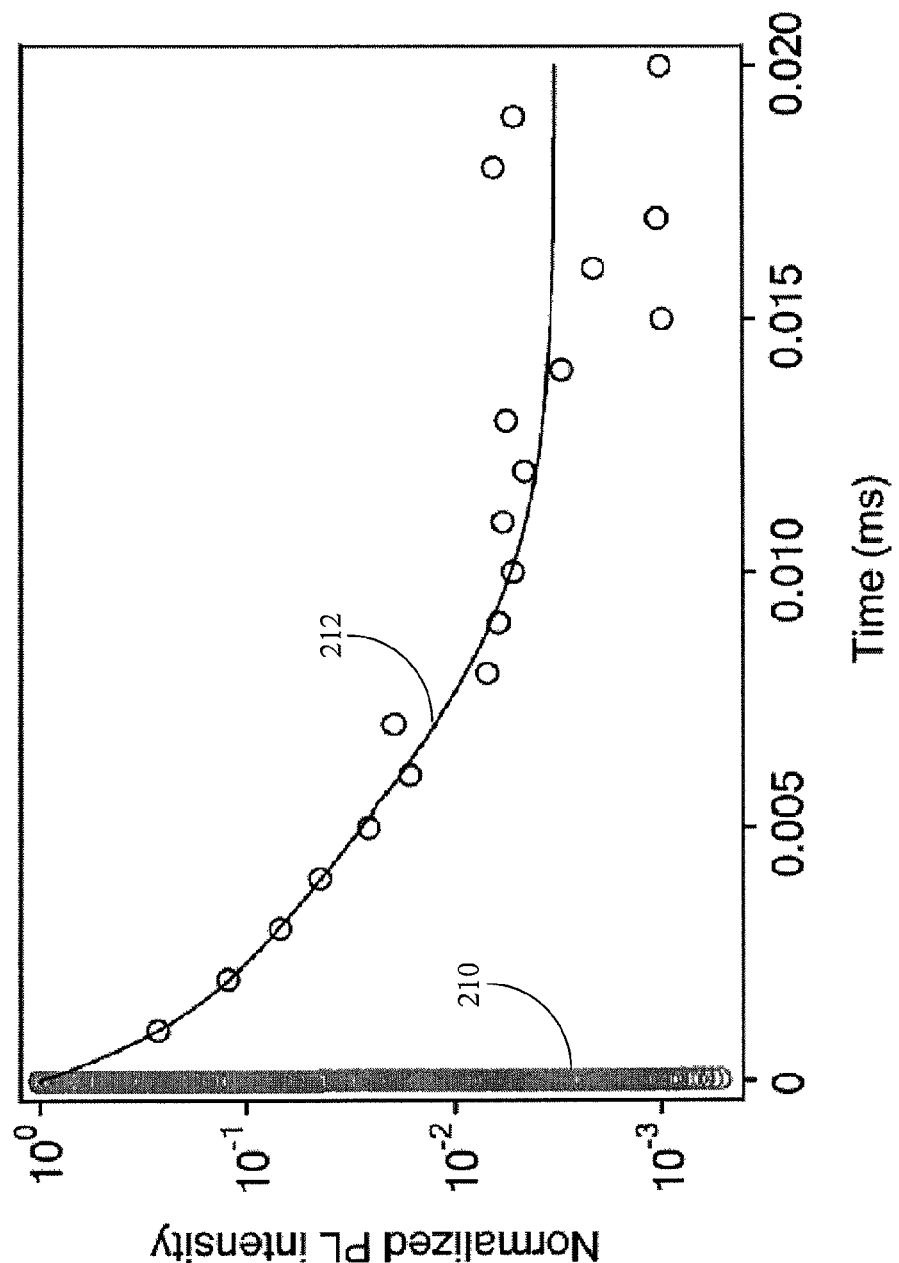
Figure 2B:
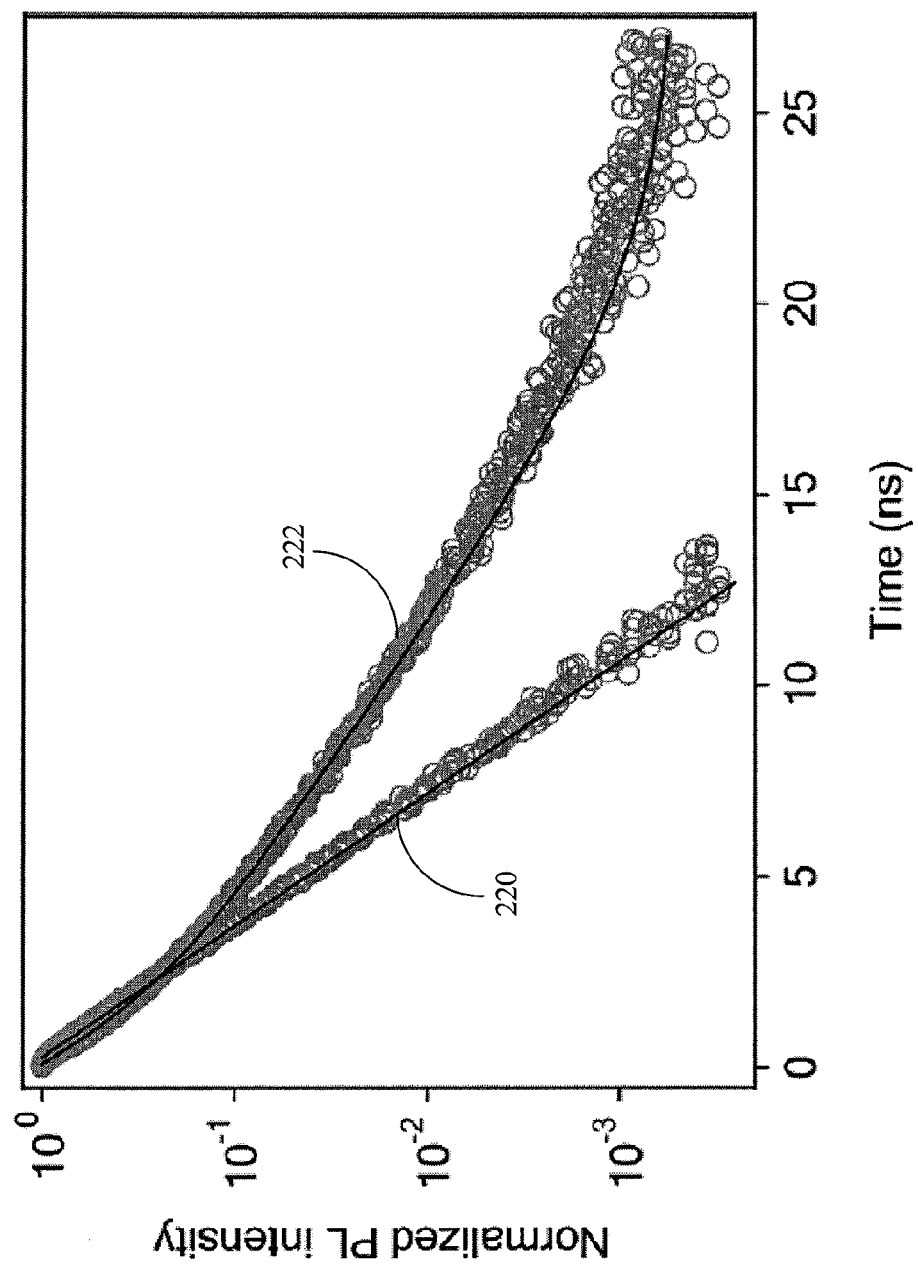
Figure 2C:
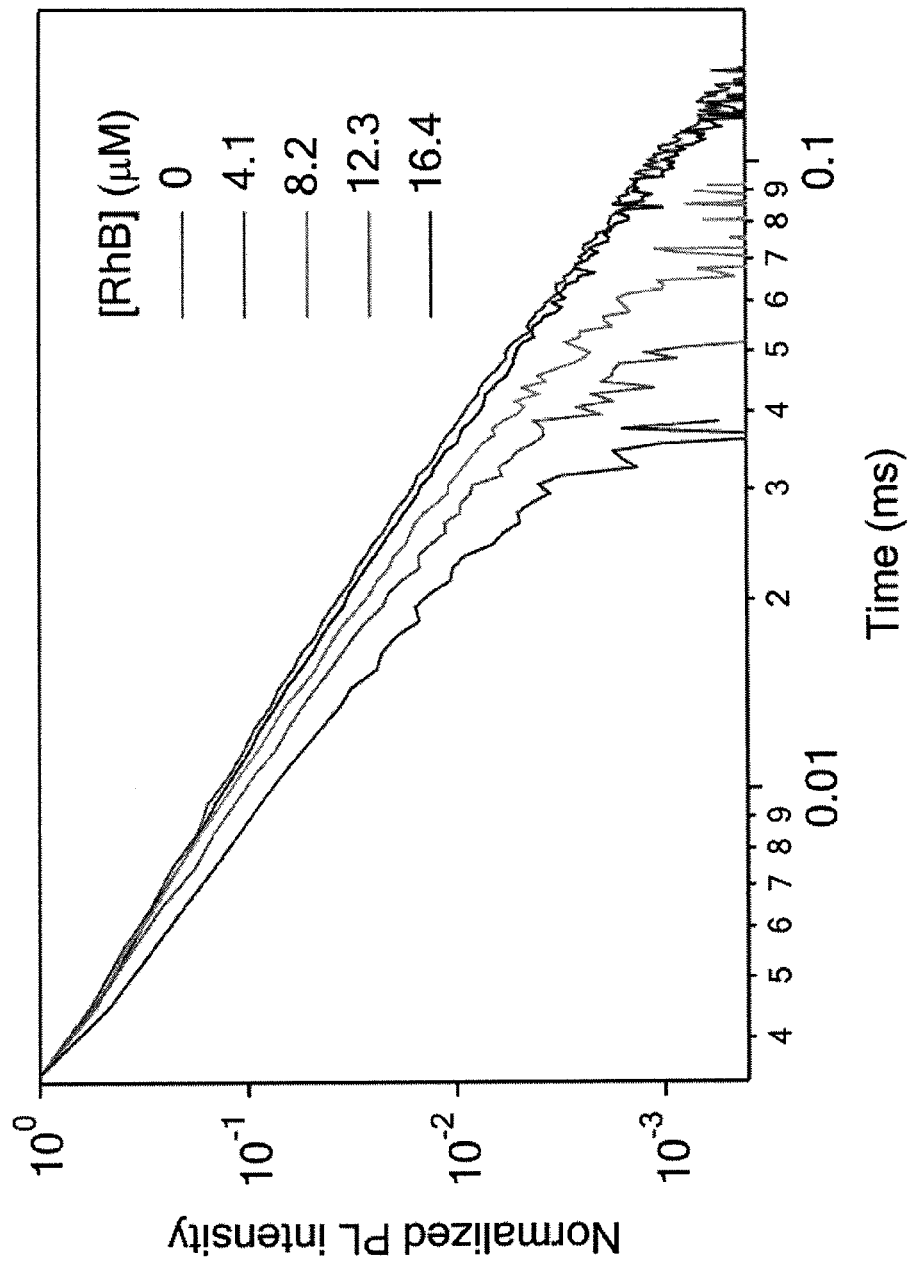

FIGS. 2A and 2B show a series of time-resolved PL measurements. FIG. 2A compares the PL decay dynamics of RhB bound to $Ga_2O_3$ nanocrystals upon excitation of $S_0$ to $S_1$ transition at 565 nm 210 and excitation into $Ga_2O_3$ nanocrystal band gap at 230 nm 212. Owing to the complete transparency of $Ga_2O_3$ nanocrystals throughout the visible part of the spectrum, RhB can be directly excited into $S_0$ to $S_1$ transition. FIG. 2B shows a comparison of the photoluminescence decay dynamics of free standing RhB in water 220 and bound to $Ga_2O_3$ nanocrystals in hexane 222. The resulting temporal decay of RhB bound to $Ga_2O_3$ nanocrystals in hexane 222 was fit with a bi-exponential function yielding an average lifetime ($<\tau>$) of 3.6 ns. This value is similar to the lifetime of free RhB molecules ($\tau$=1.5 ns), determined from the single exponential fit to the photoluminescence decay of RhB in aqueous solution 220. This behavior, typical for dye molecules, is in stark contrast with the photoluminescence decay of RhB when $Ga_2O_3$—RhB nanocrystals are excited into the $Ga_2O_3$ nanocrystal band gap. In this case, the decay rate is significantly slower, with three orders of magnitude longer average lifetime ($<\tau>$=1.5 µs). Extended lifetime suggests that RhB adopts the dynamics of DAP recombination, and confirms that RhB is excited by FRET involving DAP states in $Ga_2O_3$ nanocrystals. $Ga_2O_3$ nanocrystal to RhB FRET is also evident from a decrease in the lifetime of DAP emission with increasing concentration of RhB added to nanocrystal surfaces, which is shown in FIG. 2C.

Figure 2D:
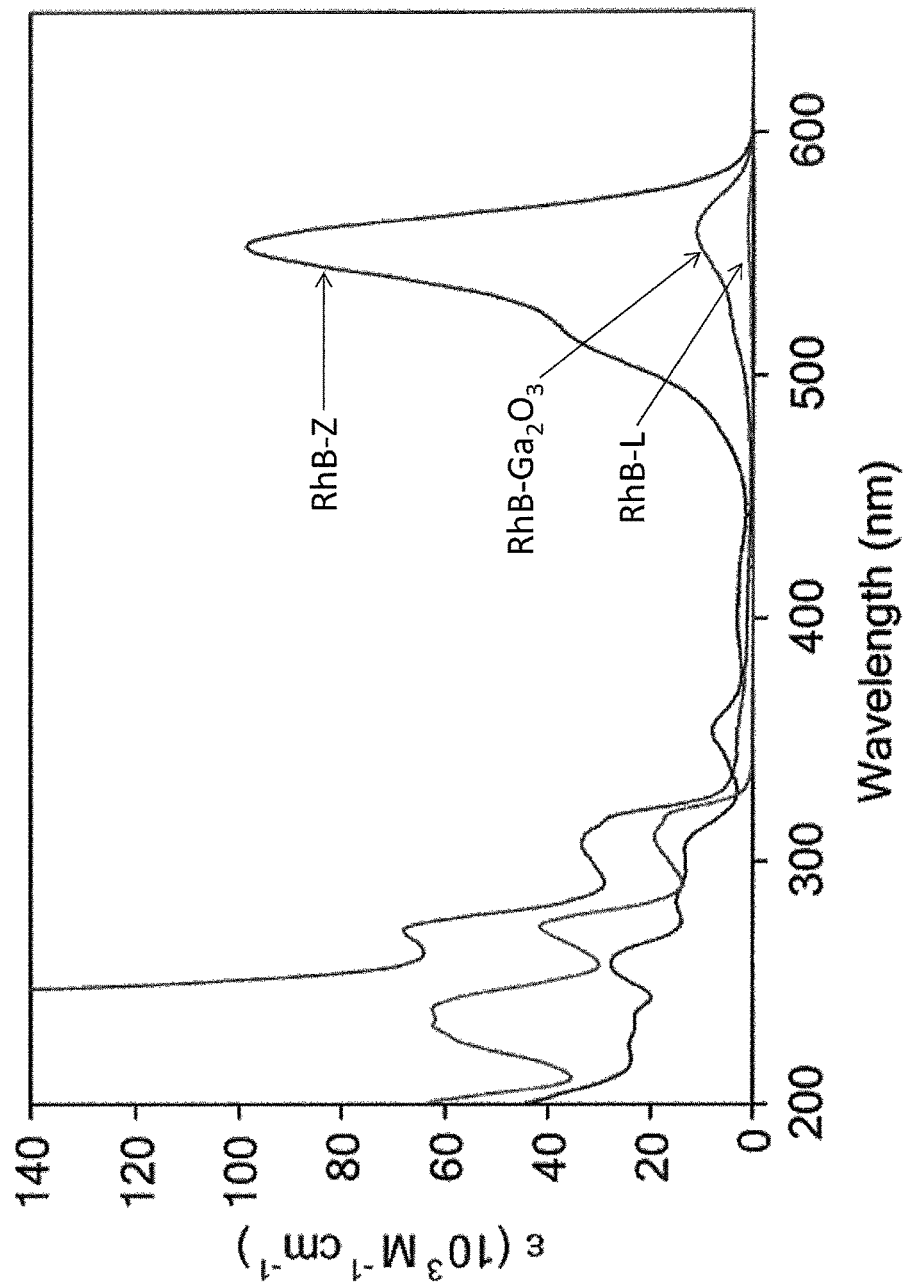

FIG. 2D compares the absorption spectra of RhB molecules dissolved in water (zwitterion, or Z form) and hexane (lactone, or L form) with those bound to $Ga_2O_3$ nanocrystals. The lactone form has very different absorption spectrum from the zwitterion form, particularly evident by the red shift and significant reduction in intensity of the S0 to S1 band with a maximum at approximately 561 nm, which is responsible for the emission of the ionic form. Consequently, RhB lactone in hexane solution does not emit in orange-red. Upon transferring RhB to $Ga_2O_3$ nanocrystal suspension the $S_0$ to $S_1$ band also experiences some red shift, and its intensity drops by a factor of approximately 9 relative to the zwitterion form. These changes indicate a distinct electronic structure of RhB upon transport into the non-polar solvent containing $Ga_2O_3$ nanocrystals. RhB can coordinate to $Ga_2O_3$ nanocrystals via carboxylic groups by replacing trioctylphosphine oxide ligands.

Figure 2E:
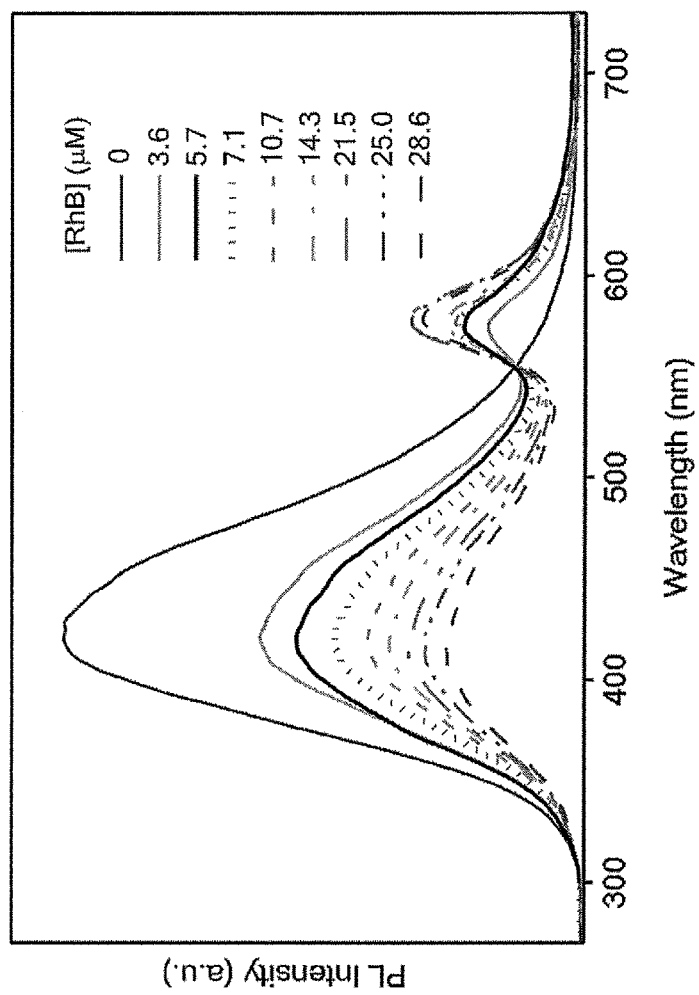

The photoluminescence spectra of $Ga_2O_3$ nanocrystals conjugated with RhB ($Ga_2O_3$—RhB nanocrystals) using different dilutions of RhB stock solution, upon excitation above the $Ga_2O_3$ band edge energy are shown in FIG. 2E. In the presence of RhB, the DAP emission quenches, while the characteristic $S_1$ to $S_0$ RhB emission band centred at approximately 578 nm appears. The RhB emission intensity increases at the expense of the DAP emission with increasing starting concentration of RhB solution, indicating the excitation of RhB by $Ga_2O_3$ nanocrystals. Assuming the excitation of RhB by FRET, the energy transfer efficiencies ($\eta_{FRET}$) for the nanocrystal sizes may be calculated, for example, using the following expression:

$$\eta_{FRET} = 1 - \frac{F_{DA}}{F_D}$$

where $F_D$ and $F_{DA}$ are relative intensities of DAP donor emission in the absence and presence of conjugated RhB acceptors, respectively. For these measurements, the same concentration of $Ga_2O_3$ nanocrystal suspensions may be based on the equal band gap absorbance, while the starting concentrations of RhB solutions were adjusted to give the same optical density of $S_0$ to $S_1$ transition of RhB bound to nanocrystals. The overlap integral $J(\lambda)$ may be calculated from the following equation:

$$J(\lambda) = \int_0^\infty F_D(\lambda)\varepsilon_A(\lambda)\lambda^4 d\lambda$$

where $\varepsilon_A(\lambda)$ is the extinction coefficient of RhB at wavelength $\lambda$. The FRET efficiency generally increases linearly as a function of the spectral overlap confirming that RhB excitation occurs by FRET mechanism.

Figure 2F:
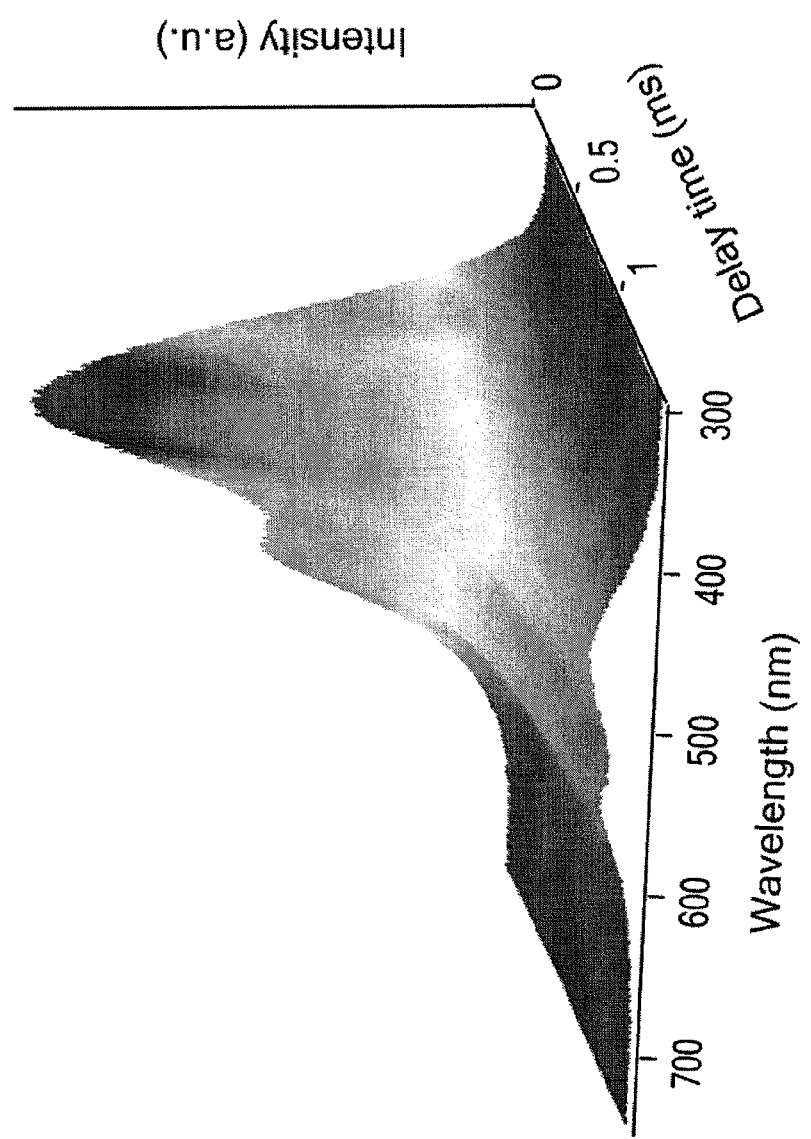

FIG. 2F shows a three-dimensional contour graph of the spectrum of colloidal $Ga_2O_3$—RhB nanocrystals as a function of the delay time after nanocrystal excitation. The afterglow of the dual emission persists for several milliseconds after excitation, which is a favorable feature of this system.

The cumulative implication of the graphs of FIG. 2 is that $Ga_2O_3$—RhB hybrid nanocrystal system acts as a single illumination entity, allowing for the generation of uniform and homogeneous white light with tunable chromaticity and long lifetime. Accordingly, the hybrid material produced using embodiments herein is intended to act as a single illumination entity (an artificial molecular fluorophore), rather than a mixture of different components i.e. phosphors, and thus allows for a uniform and homogeneous white light emission. This development of a single illumination entity is believed to be demonstrated by the fact that, in solution, RhB has a characteristic excited state decay time of a few nanoseconds (depending on the solvent it is dissolved in), while the measured excited state decay time of RhB bound to nanocrystals is on the order of microseconds, upon nanocrystal excitation. Accordingly, the RHB decay rate has been harmonized with the decay rate of the $Ga_2O_3$ It follows from this that the lifetime of RhB bound to nanocrystals will be determined by the dynamics of nanocrystal emission, and therefore a hybrid LED made in accordance with embodiments herein functions as a single white light emitting fluorophore.

It is further noted that the broad emission spectrum of $Ga_2O_3$ nanocrystals has a strong overlap with the absorption spectrum of RhB (which is chosen by design based on its electronic structure), thereby allowing for a very efficient energy transfer (around or up to 60%) and white light conversion. This produces a more efficient approach for white light creation than by direct excitation, which is typically used in multi-component white LEDs. Furthermore, the RhB binding procedure on $Ga_2O_3$ nanocrystals, as described above, allows for precise control of the covalent binding and concentration of RhB molecules on nanocrystal surfaces, resulting in purer white light than an illusion/approximation of white light.

As noted above, the light emitting characteristics of nanocrystals are tunable. This is accomplished by tuning the DAP photoluminescence band by changing the $Ga_2O_3$ nanocrystal size and is facilitated by the ability to process the material from solution. The ability to tune DAP emission by changing nanocrystal size allows for using different attached orange or red emitting molecules and even semiconductor quantum dots (CdSe, CdTe etc.) to achieve particular characteristics, such as thermal or photo-stability and advanced functionality, in addition to white light emission.

Attachment of the secondary flourophore can be achieved directly, for example, by covalent binding to Ga2O3 nanocrystals via metal-binding functional groups. The secondary flourophore can also be bound or coupled indirectly by using a bonding agent or by encapsulation of the primary and secondary fluorophores in nanoparticles, such that the primary fluorophore and secondary fluorophore achieve non-radiative dipole-dipole coupling. The nanoparticles may be silica nanoparticles. Direct binding may be suitable for, for example, organic molecules such as RhB, ATTO 565 free carboxylic acid dye, etc. Indirect binding may be suitable for, for example, quantum dots, in order to form all-inorganic LEDs.

As noted above, FRET effects enable radiative decay engineering of white LEDs having suitable characteristics for a range of applications. More specifically, one aspect of the embodiments herein involves modification of the fluorophores (luminescent molecules) by increasing or decreasing their radiative decay rates. By placing the fluorophores (an acceptor) at suitable distances from the nanocrystal (a donor), FRET can occur to modify emission from the fluorophores. Application of FRET enables the generation of blue and orange emissions (or alternatively, emissions of the 3 primary colours: red, green, blue) using two components by absorbing only a single wavelength corresponding to the primary fluorophore. For example, two types of secondary fluorophores emitting in green and red can be bound to $Ga_2O_3$ nanocrystal surfaces, allowing for the generation of primary colors and white light formation by single wavelength excitation. This contrasts with conventional methods where the use of FRET would not be practical as there may be insufficient control of light emitting characteristics and the components of the hybrid system may be difficult to design and expensive to synthesize/process. The embodiments as described herein are formed such that a single excitation energy value may be used, thus enabling radiative engineering using FRET. The ability to utilize FRET effects enables the expansion of the emission range and assists with producing a white light emitting material. Furthermore, the utilization of FRET effects has the advantage of enabling the modification of FRET conditions so as to optimize the characteristics of the white LEDs based on excitation of the donor using a predetermined excitation energy. The FRET conditions that may be varied include, for example, the distance between the donor and acceptor, the donor and acceptor spectral overlap and the emission spectrum of the two components. The average distance between FRET donor and acceptor may be adjusted by the adjusting the surface concentration of the secondary fluorophore or insertion of a molecular spacer. Additionally FRET conditions may be adjusted by change of spectral overlap by adjusting nanocrystal size and type of secondary fluorophore.

Figure 2G:
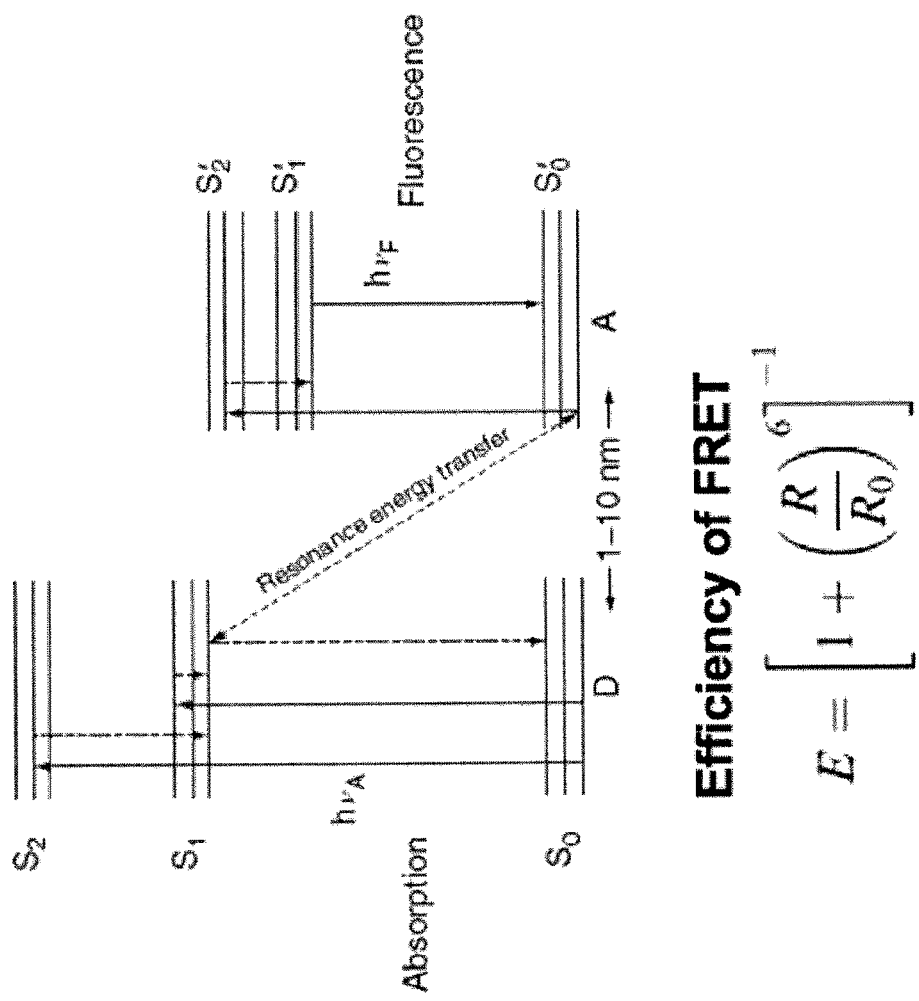
Figure 2H:
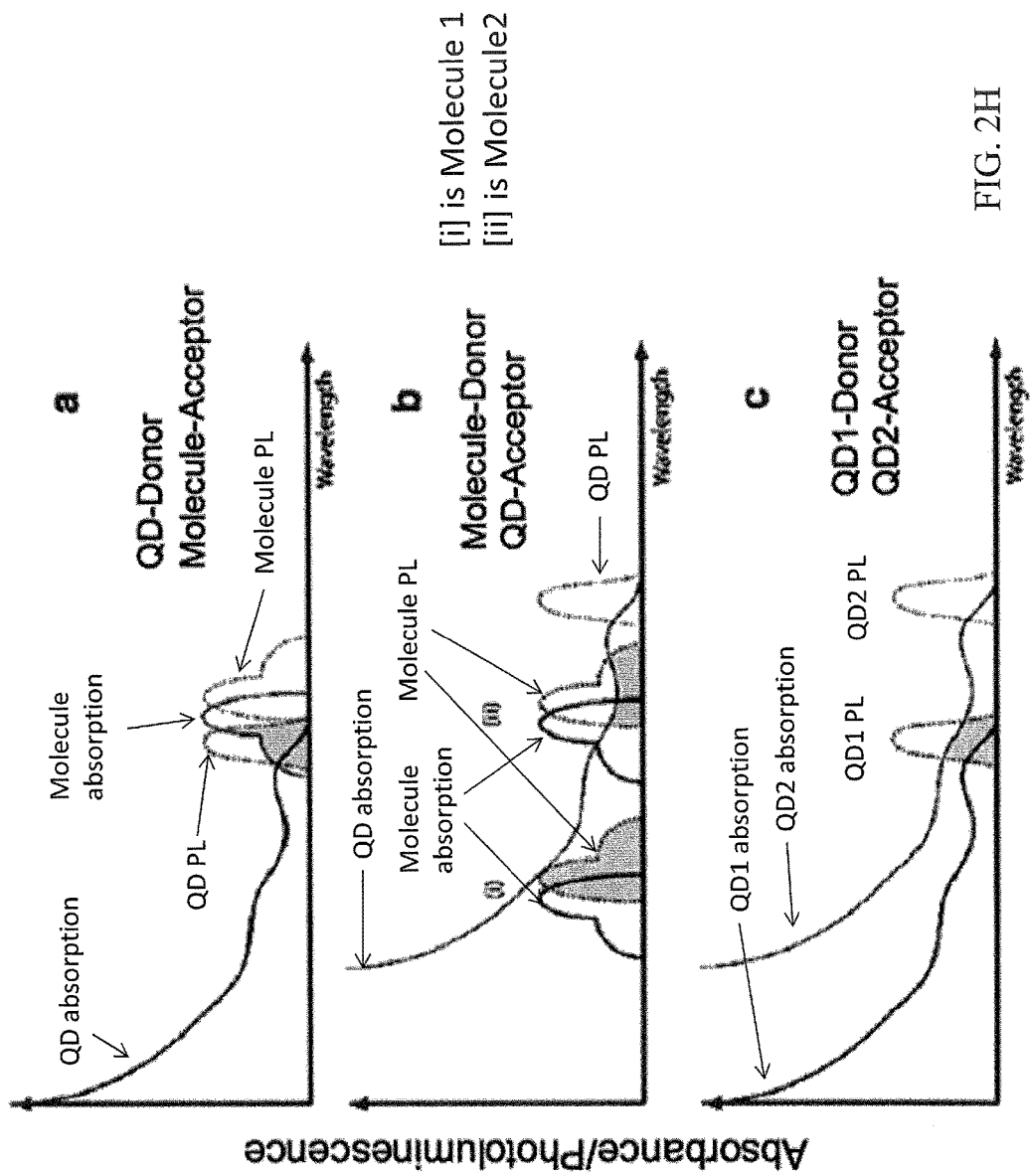
Figure 2J:
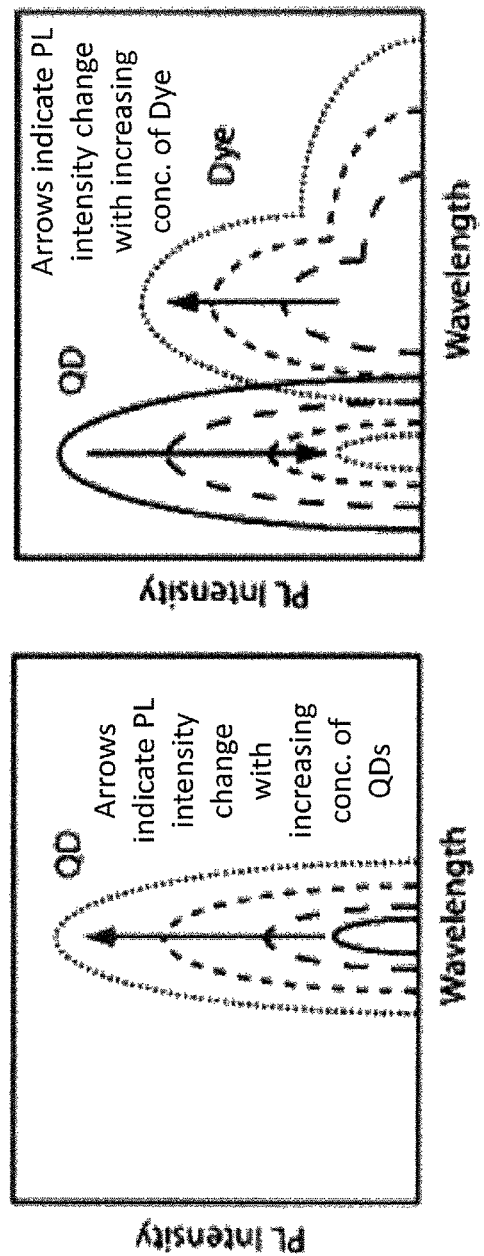
Figure 2K:
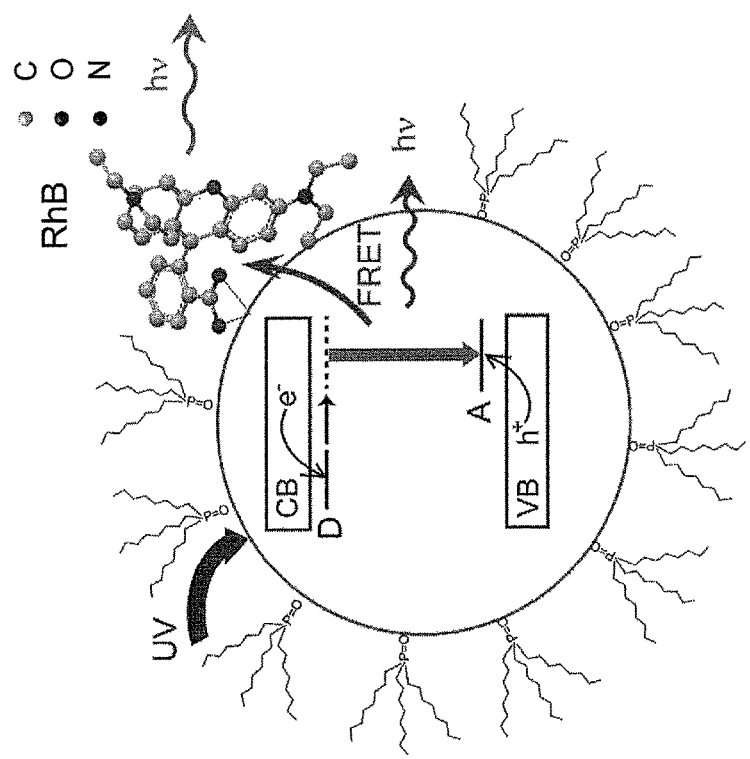

FIGS. 2G to 2K describe certain parameters of FRET relevant to its application in accordance with embodiments herein. FIG. 2G illustrates that FRET is a universal process involving a transfer of the excitation energy from an electronically excited donor species to an acceptor chromophore in the ground state. FIG. 2G illustrates that FRET generally occurs for the separation between donors and acceptors of up to 10 nm. FIG. 2H illustrates that in the weak coupling limit the energy conservation of FRET is enabled by the spectral overlap of the donor emission and acceptor absorption, where donors and acceptors can be for example both molecular species and quantum dots. FIG. 2J illustrates that this electronic interaction involves a coupling of transition moments of the donor and acceptor, which is conceptually analogous to coupled oscillators. FIG. 2K is a schematic representation of the coupling between colloidal $Ga_2O_3$ and nanocrystal surface-bound RhB by resonance energy transfer (RET). Upon $Ga_2O_3$ band gap excitation (UV) the excited donor (D)-acceptor (A) pairs are formed allowing for DAP recombination (blue hv emission) and excitation of RhB (orange hv emission) by RET. The two simultaneously emitting components (blue and orange) can be adjusted to produce white light. FRET effects depend on distance, spectral overlap and transition dipole orientation.

Figure 3A:
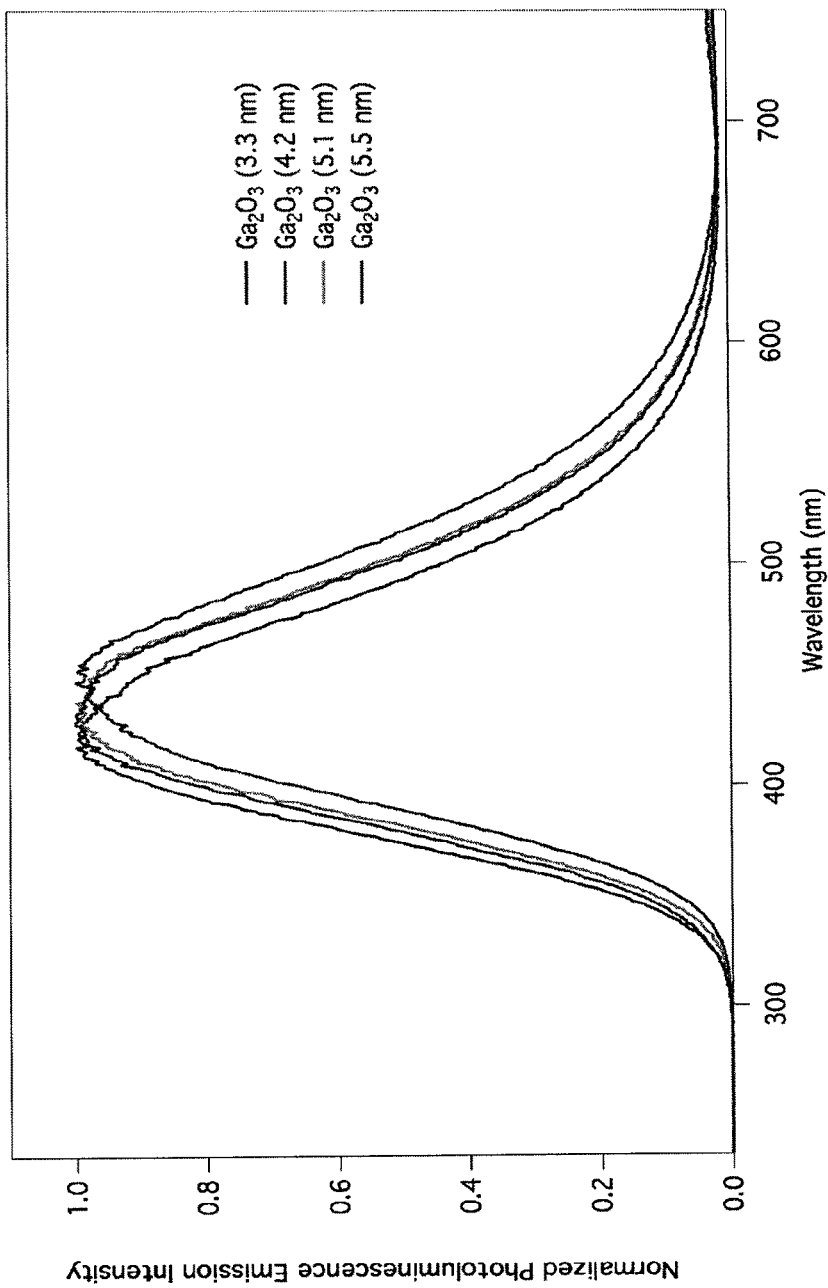
FIGS. 3A to 3C illustrate one aspect of an embodiment, specifically the photoluminescence properties of γ-$Ga_2O_3$ nanocrystals.
Figure 3B:
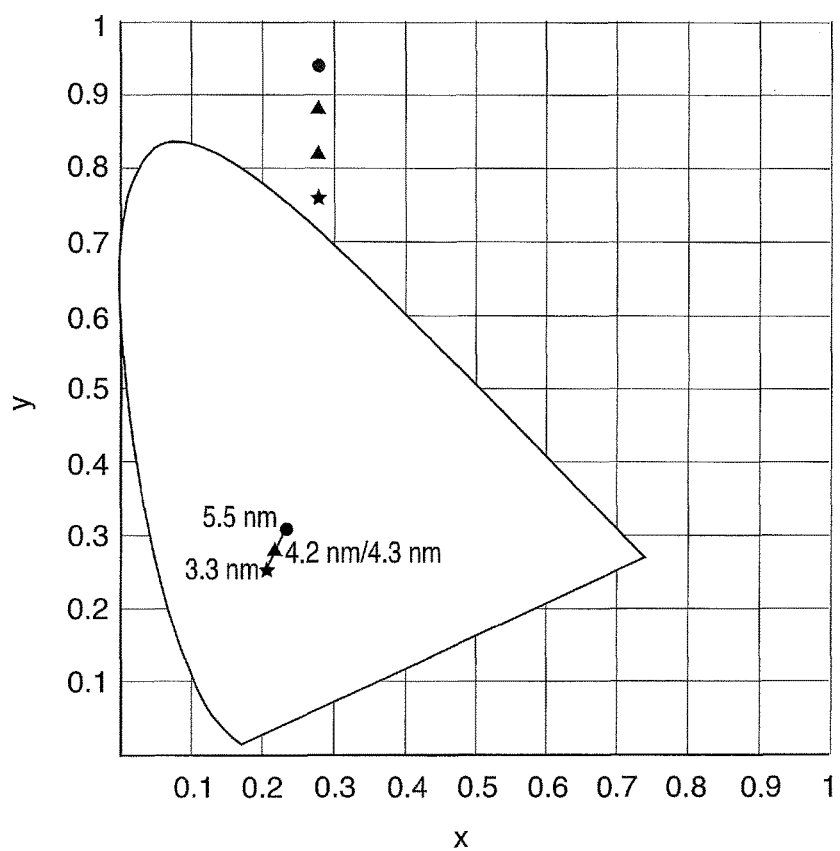

FIGS. 3A and 3B illustrates different photoluminescence properties of various sizes of a primary fluorophore, in this case γ-$Ga_2O_3$. Size-tunable γ-$Ga_2O_3$ may be synthesized by using gallium acetylacetonate as a metal precursor and oleylamine as a coordinating solvent under high temperature in an inert atmosphere. It should be understood that the photoluminescence properties of $Ga_2O_3$, for example, are associated with inherent internal defects. These defects are tunable using a number of different synthesis conditions, such as, temperature, aerobic/anaerobic environments, and the like. For example, size variance of between 3.3 nm (deep blue) to 5.5 nm (turquoise) may be achieved by selecting different synthesis temperatures. A higher temperature results in larger particles, and therefore shifts the emission range toward red because of the lowering of the blue component with the increase in particle size.

Figure 3C:
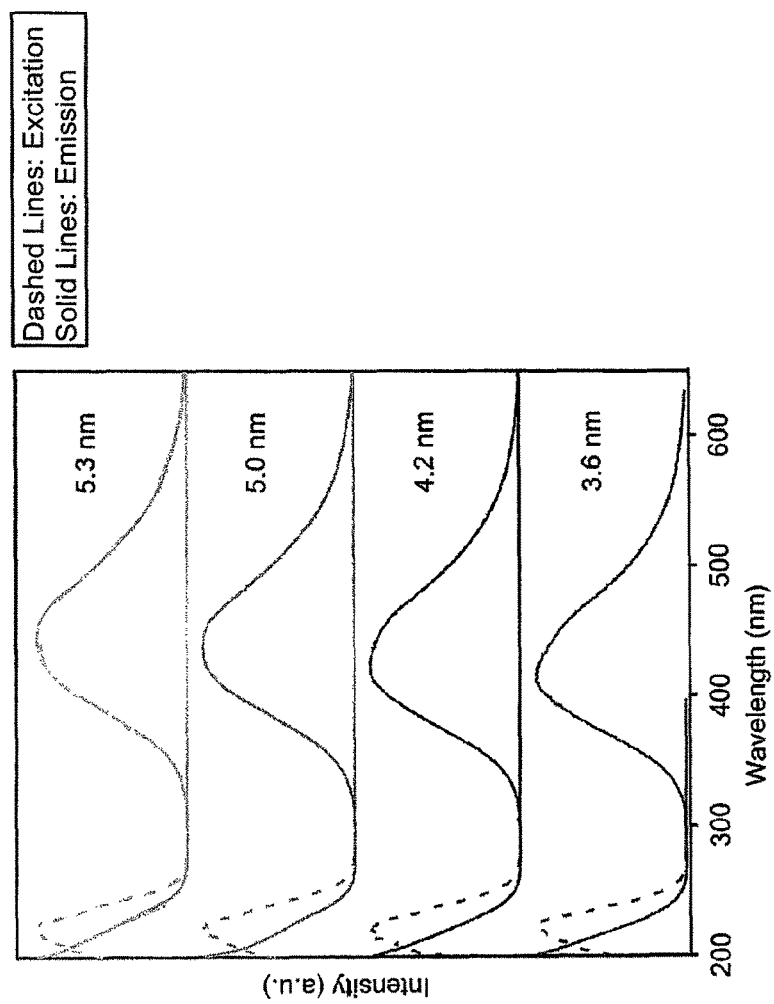

FIG. 3C illustrates the absorption and photoluminescence spectra of colloidal $Ga_2O_3$ nanocrystals having different sizes. The corresponding excitation spectra are shown with dashed lines. The emission spectra were collected upon excitation at 230 nm, while excitation spectra were recorded by monitoring photoluminescence and the maximum of the photoluminescence band for a given nanocrystal sample. The absorption and excitation spectra are insensitive to the change on nanocrystal size, indicating the absence of quantum confinement in the given size regime. The photoluminescence spectra red-shift with increasing nanocrystal size ranges from 415 nm (for 3.6 nm diameter nanocrystals) to 445 nm (for 5.3 nm diameter nanocrystals). This shift predominantly arises from an increase in the average donor-acceptor separation with increasing nanocrystal size. An increased separation between donors and acceptors results in smaller Coulomb interaction contribution to the photoluminescence energy, and therefore a shift of the donor-acceptor pair emission band to lower energies.

Figure 4A:
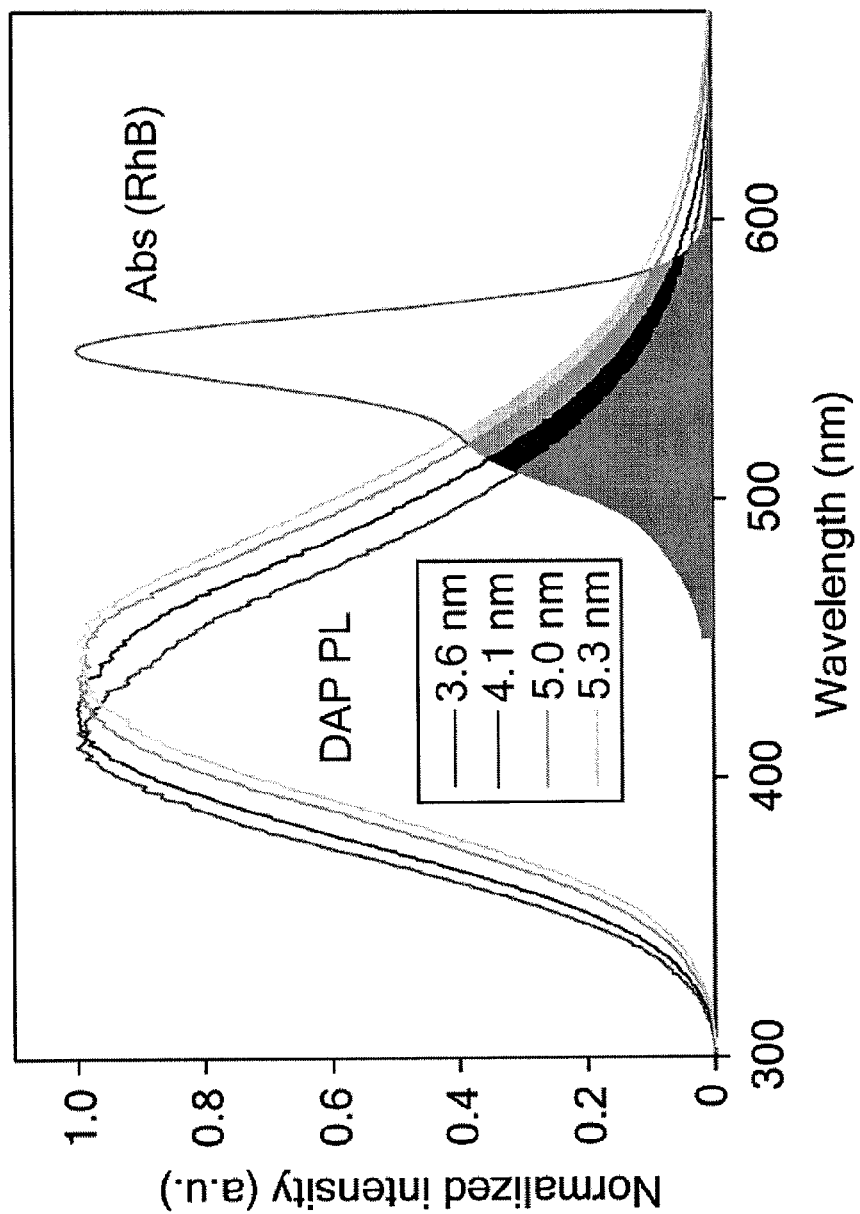
FIGS. 4A and 4B illustrate the utilization efficiency of FRET, according to an embodiment.
Figure 4B:
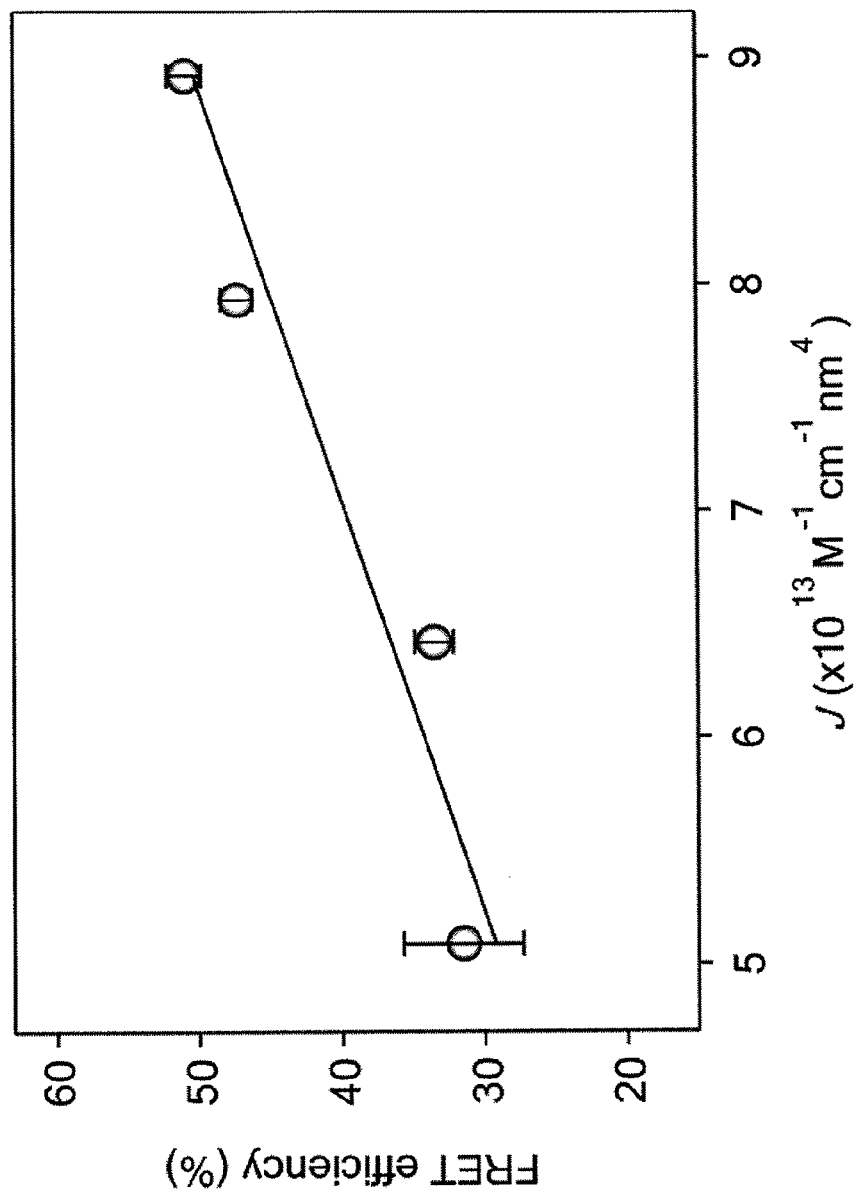

FIGS. 4A and 4B are graphs which illustrate the FRET efficiency control. More specifically, FIG. 4B indicates that size-tunability enables FRET efficiency of between, approximately 30% to 50%, depending on the nanocrystal size. The same concentration of RhB is obtained for different sizes of $Ga_2O_3$, which in turn provides desirable energy transfer efficiency because of the enhancement of RhB emission and quenching of the $Ga_2O_3$.

Figure 5:
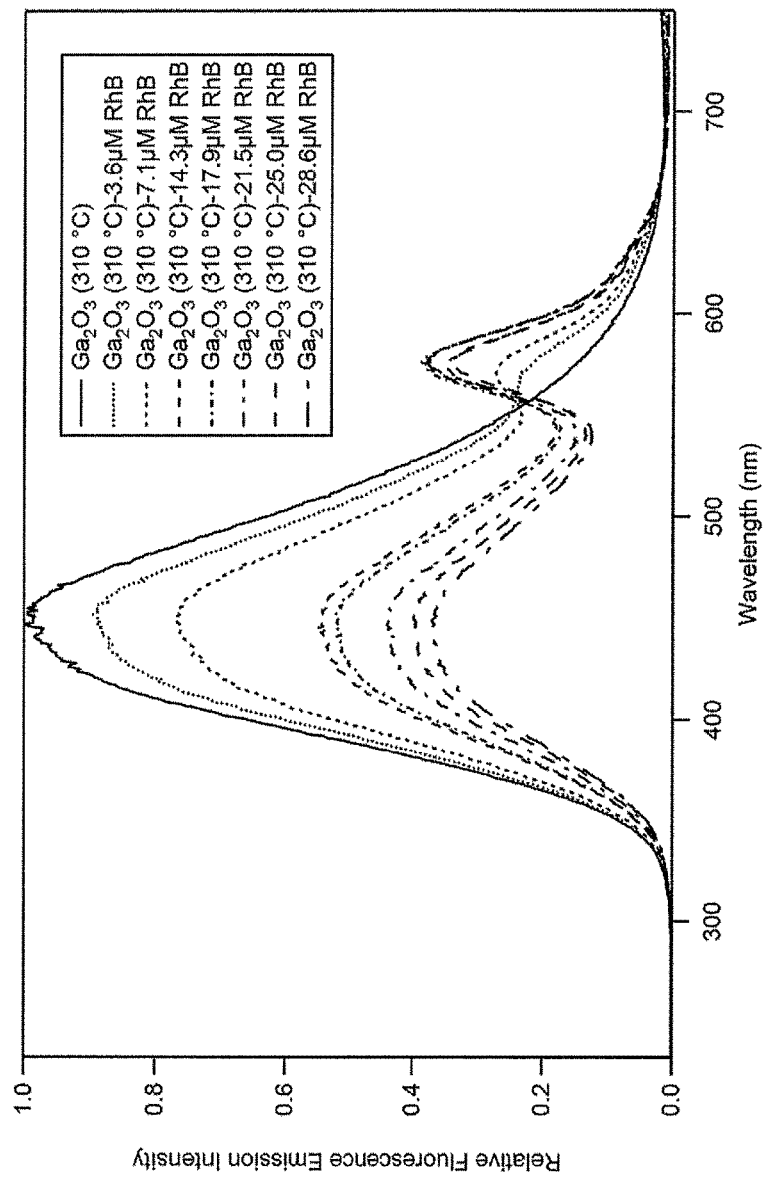
FIG. 5 illustrates the variability of photoluminescence characteristics of hybrid nano-composite by altering the concentration of secondary fluorophore on nanocrystals, according to an embodiment.

FIG. 5 illustrates the variability of photoluminescence characteristics by altering the concentration of RhB on the nanocrystals, in this case $Ga_2O_3$. The adsorption of the luminescent molecules on nanocrystal surfaces may be accomplished for example by applying certain techniques. The dye molecule, RhB, may be covalently bound to the surface of $Ga_2O_3$ nanoparticles. The nanoparticles may be dispersed in, for example, hexane whereas the fluorophore RhB may be dissolved in water. The two components interact at the boundary of the two solvents, allowing the RhB to phase transfer into the hexane phase when it is bound to the surface of the nanoparticles. This technique is suitable for manufacturing white light LEDs, or generally, to tune the emission colour of the LEDs and may also work for various other lighting applications. It should be understood however that other techniques may be used to enable the adsorption/binding of the luminescent species in relation to the nanocrystal surfaces. Additionally, by varying the concentration of RhB in the water phase, the amount of RhB bound to the surface of the nanoparticle may be varied, and thus the concentration of RhB on the nanoparticle surface.

During the energy transfer process, the excitation energy in the donor ($Ga_2O_3$ nanocrystals for example) will be transferred non-radiatively to its neighbouring acceptors without any emission during the transfer process. Hence, as more acceptors are in close proximity to the donor, the likelihood for a non-radiative energy transfer process will increase, leading to a lowering of the nanoparticles photoluminescence emission intensity. On the other hand, the emission intensity of the acceptor will be enhanced based on the energy that is transferred from the donor that is located within a specific distance of up to about 10 nm.

In order to determine the ideal size of nanoparticles (for example, $Ga_2O_3$) and the ratio between nanoparticles and fluorophore (for example, RhB), different concentrations of fluorophore may be bound on the surface of the nanoparticles. Subsequently, the CIE chromaticity coordinates of different concentration of RhB, but with a fixed amount of $Ga_2O_3$, may be calculated. For example, FIG. 6A illustrates the photoluminescence spectra of colloidal Ga2O3 nanocrystals-RhB hybrid nanomaterial with different concentrations of RhB. The table in FIG. 6A illustrates the CIE coordinates of $Ga_2O_3$ nanocrystals-RhB corresponding to different emission colors, including white light emission. The CIE coordinates of each sample is determined based on the photoluminescence emission spectrum of individual sample using the color matching functions. The color matching functions are based on the spectral power distribution and the emission intensity, both as a function of wavelength.

Figure 6B:
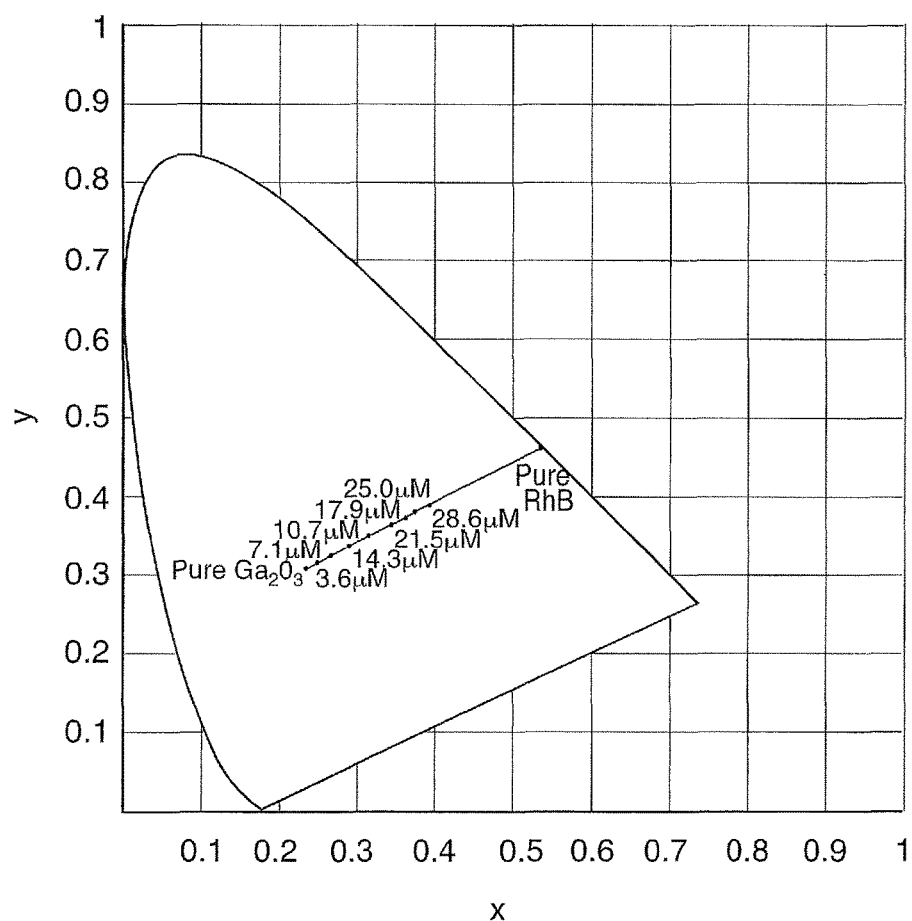

As a further example, FIG. 6B illustrates CIE coordinates obtained from the photoluminescence spectra for $Ga_2O_3$ (approximately 5.6 nm)—RhB.

Figure 7:
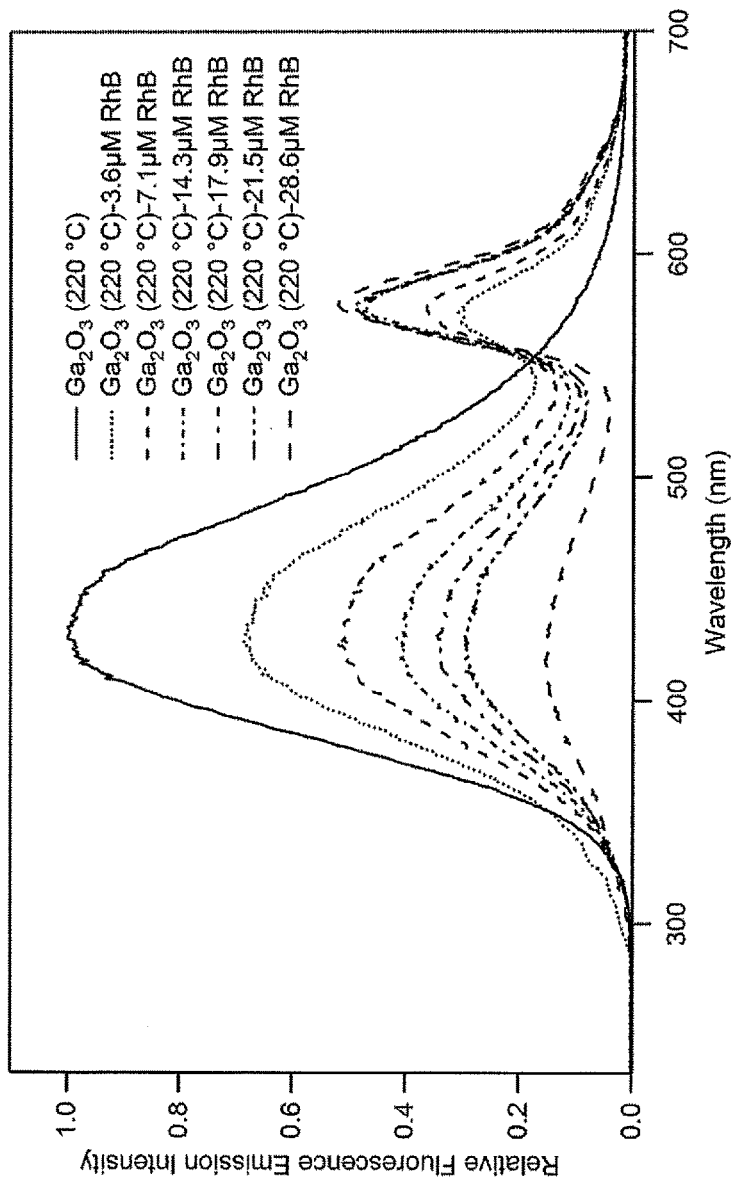
FIG. 7 illustrates the photoluminescence spectra for $Ga_2O_3$ (approximately 4.4 nm)—RhB for different RhB concentrations, according to an embodiment.

FIG. 7 illustrates the photoluminescence spectra for $Ga_2O_3$ (approximately 4.4 nm)—RhB for different RhB concentrations.

Figure 8B:
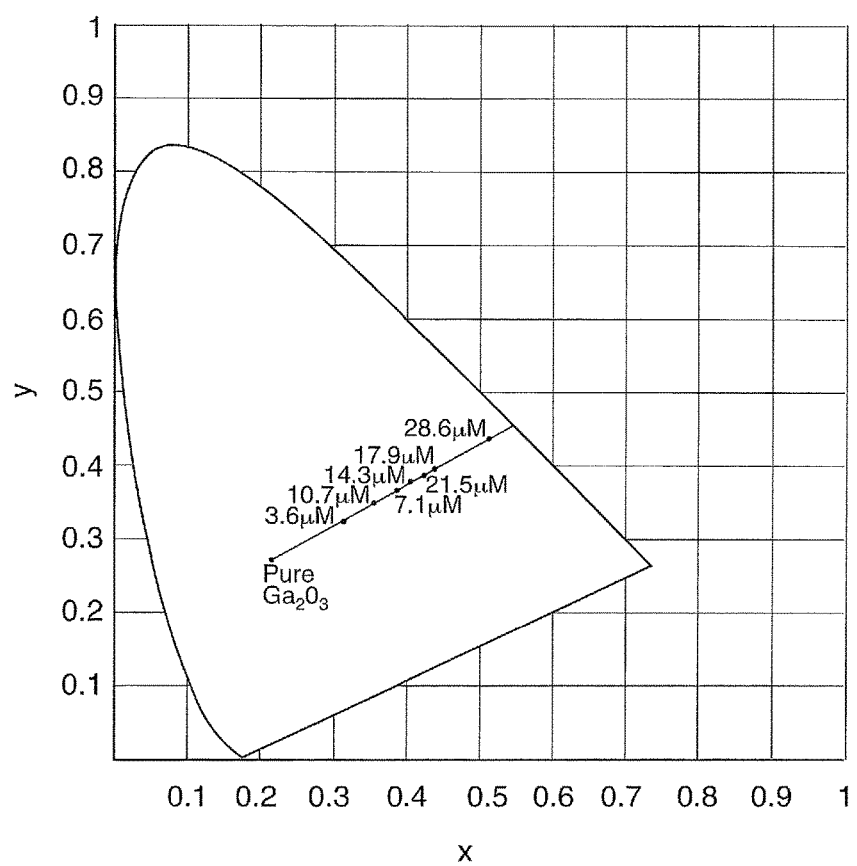

FIGS. 8A and 8B map $Ga_2O_3$ (approximately 4.4 nm)—RhB photoluminescence using a further CIE chromaticity diagram.

Figure 9:
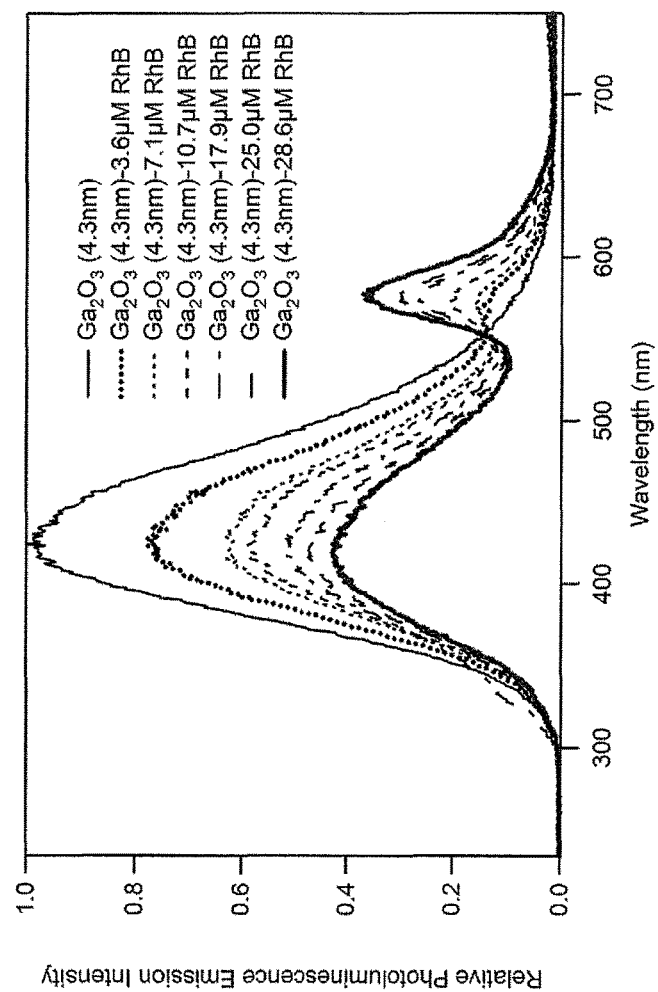
FIG. 9 illustrates the photoluminescence spectra for $Ga_2O_3$ (approximately 4.3 nm)—RhB for different RhB concentrations, according to an embodiment.

FIG. 9 illustrates the photoluminescence spectra for $Ga_2O_3$ (approximately 4.3 nm)—RhB for different RhB concentrations.

Figure 10B:
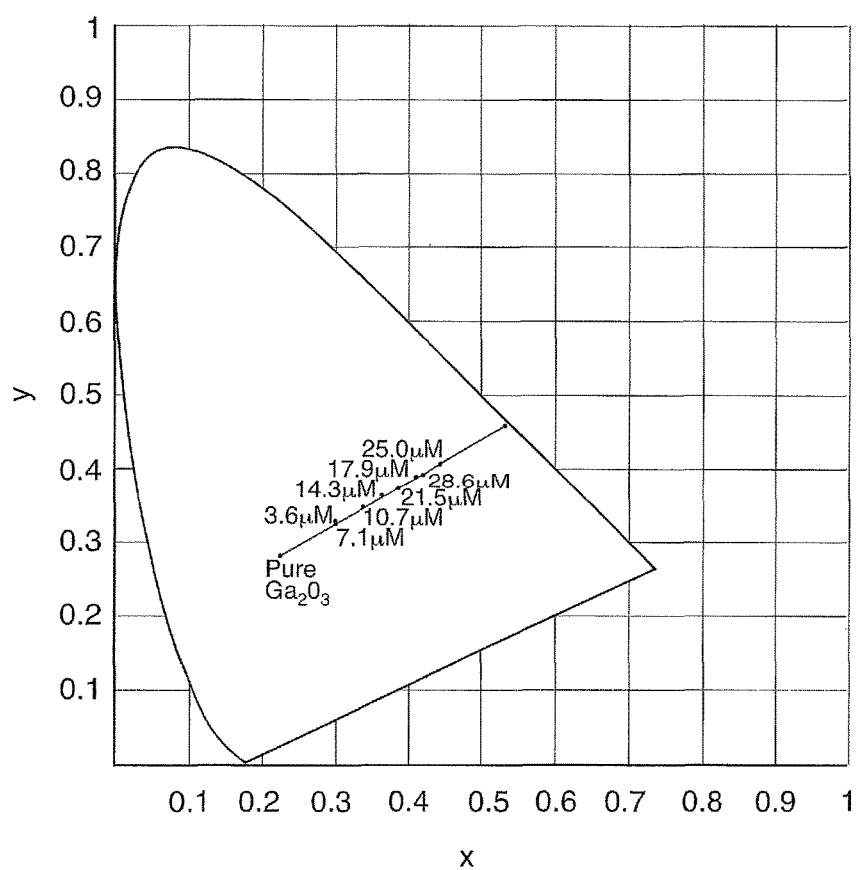

FIGS. 10A and 10B map $Ga_2O_3$ (approximately 4.3 nm)—RhB photoluminescence using a further CIE chromaticity diagram.

Figure 11:
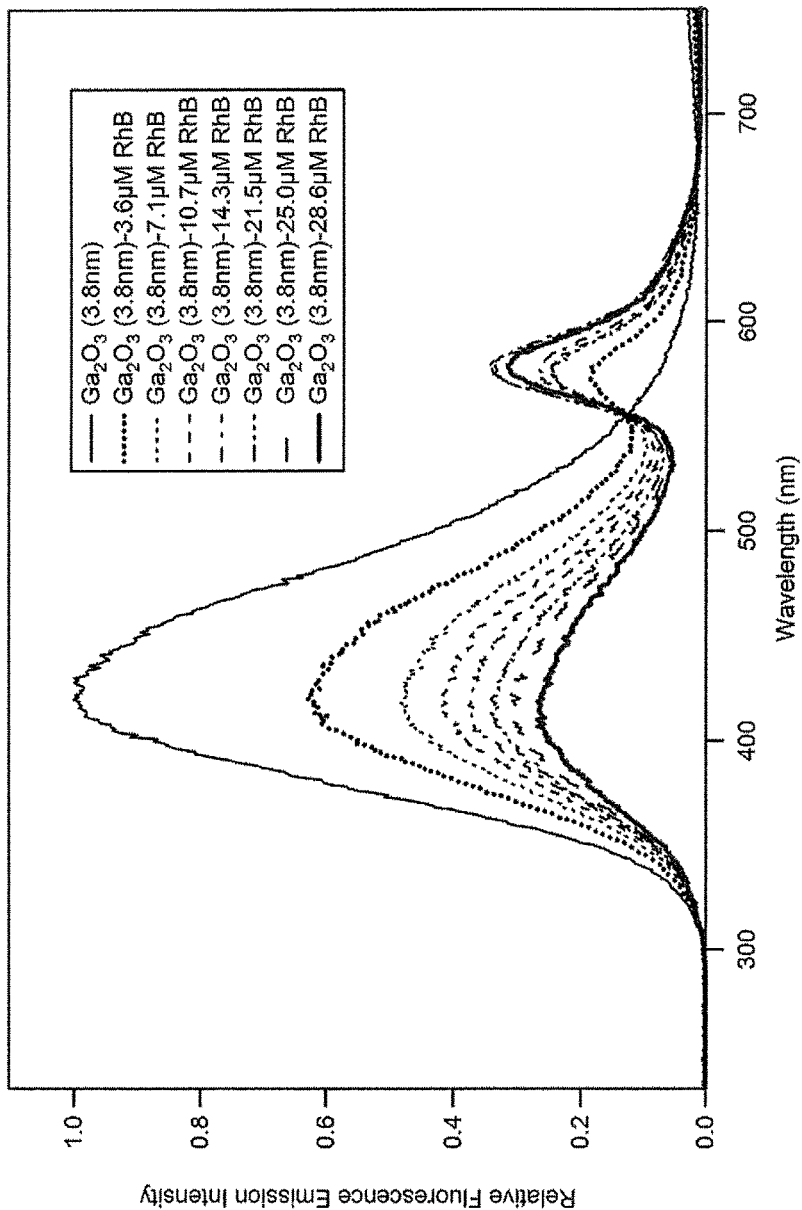
FIG. 11 illustrates the photoluminescence spectra for $Ga_2O_3$ (approximately 3.8 nm)—RhB for different RhB concentrations, according to an embodiment.

FIG. 11 illustrates the photoluminescence spectra for $Ga_2O_3$ (approximately 3.8 nm)—RhB for different RhB concentrations.

Figure 12B:
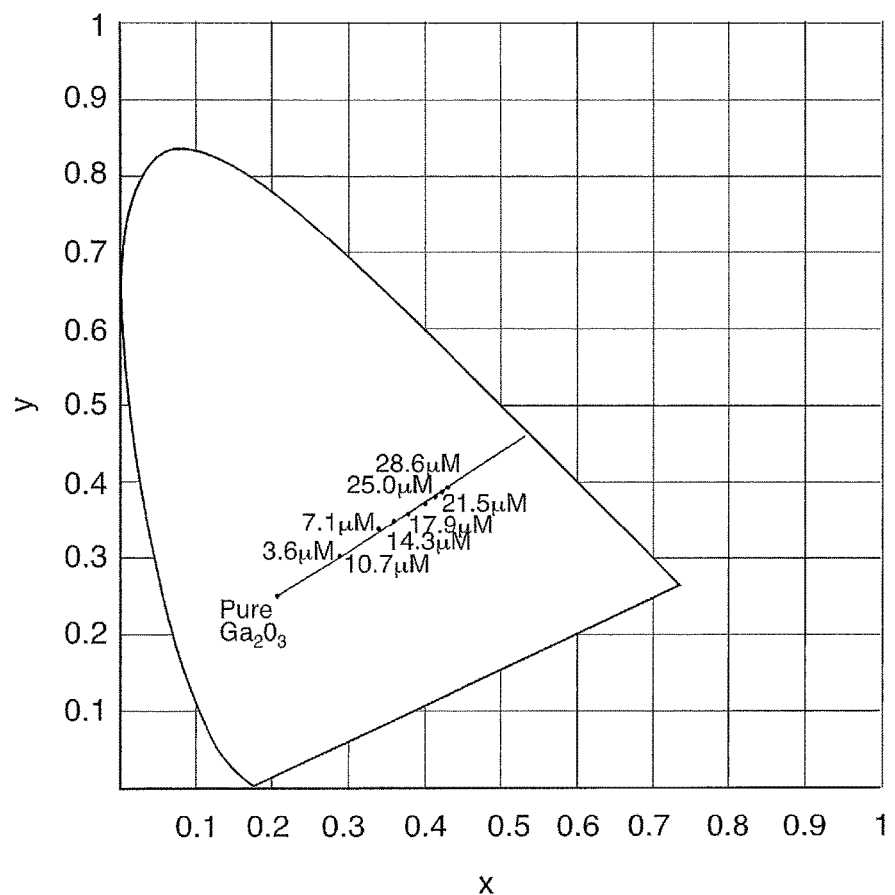
Figure 13A:
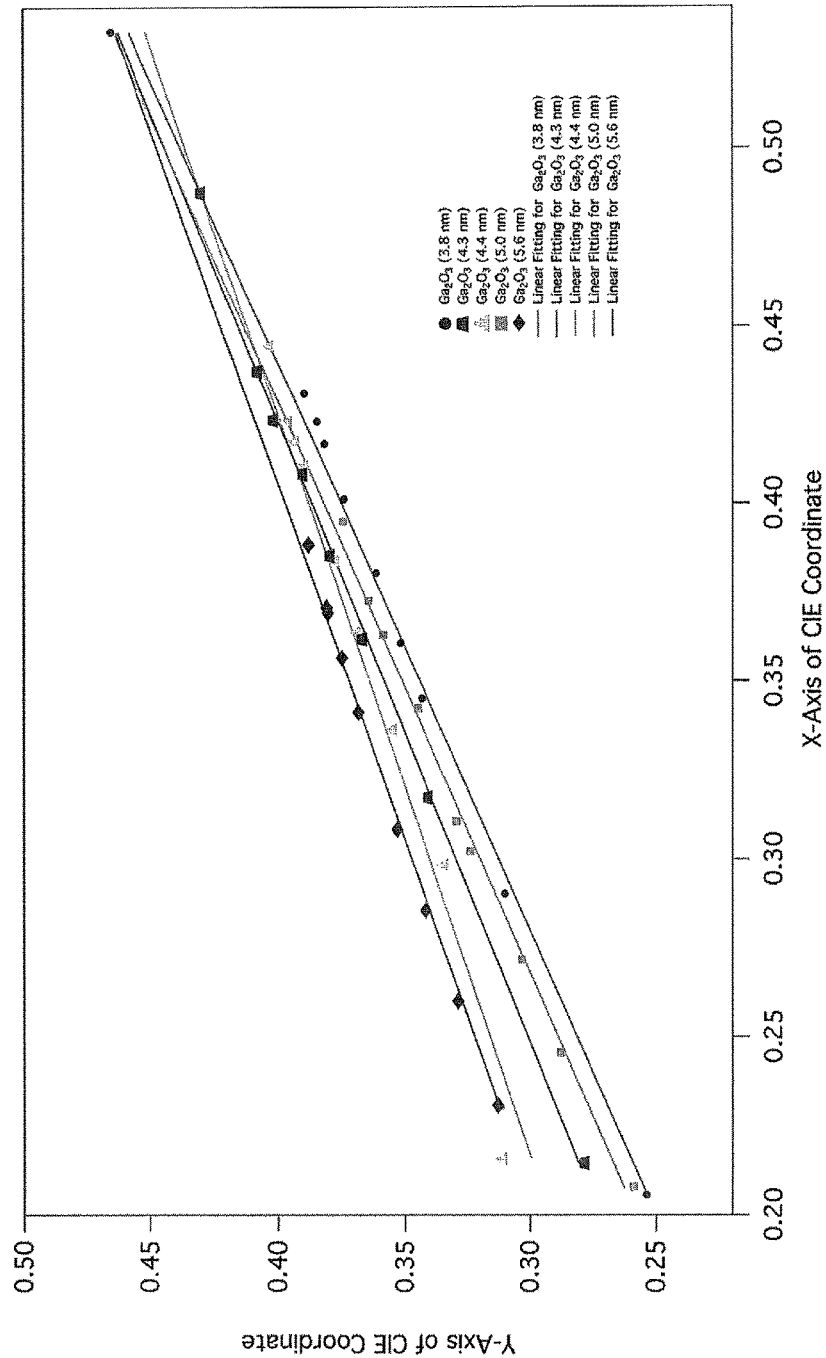
FIG. 13A illustrates a modeling analysis of one example of a size of $Ga_2O_3$ nanoparticles that can achieve "pure" white light, according to an embodiment.
Figure 13B:
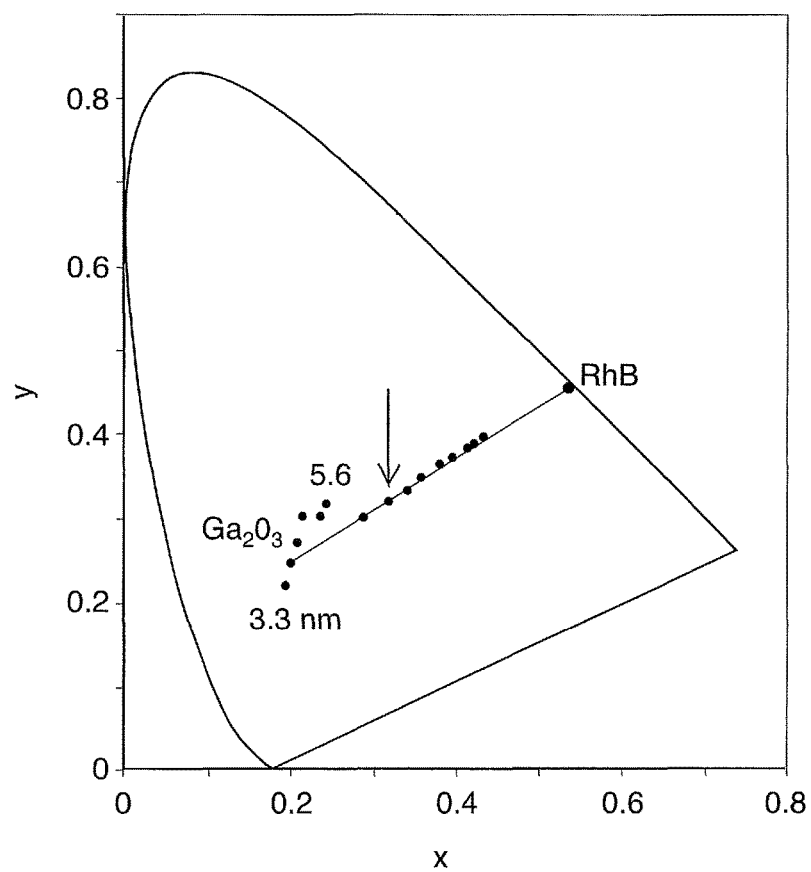
FIG. 13B illustrates a CIE 1931 color space chromaticity diagram indicating various color points, with pure white light indicated, according to an embodiment.
Figure 14A:
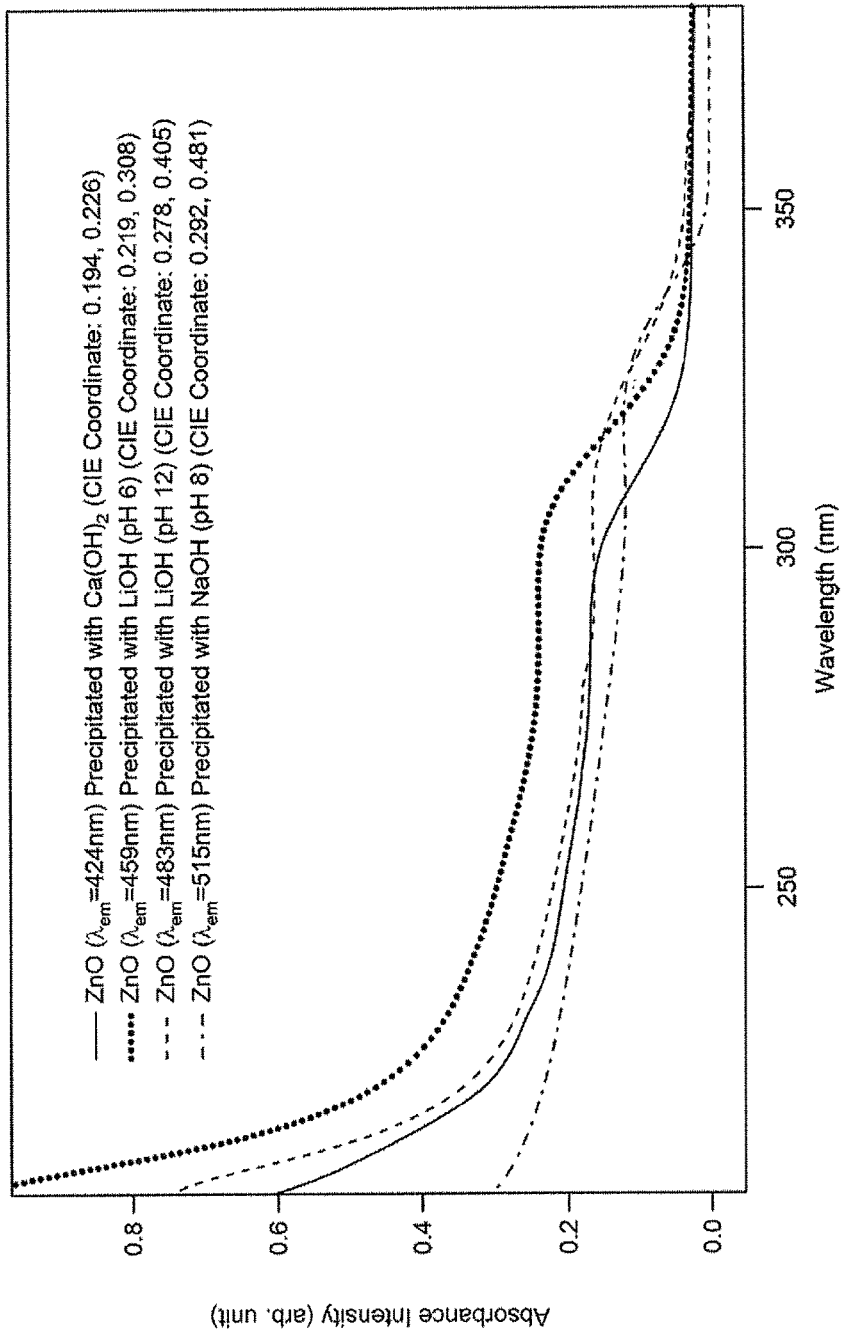
Figure 14B:
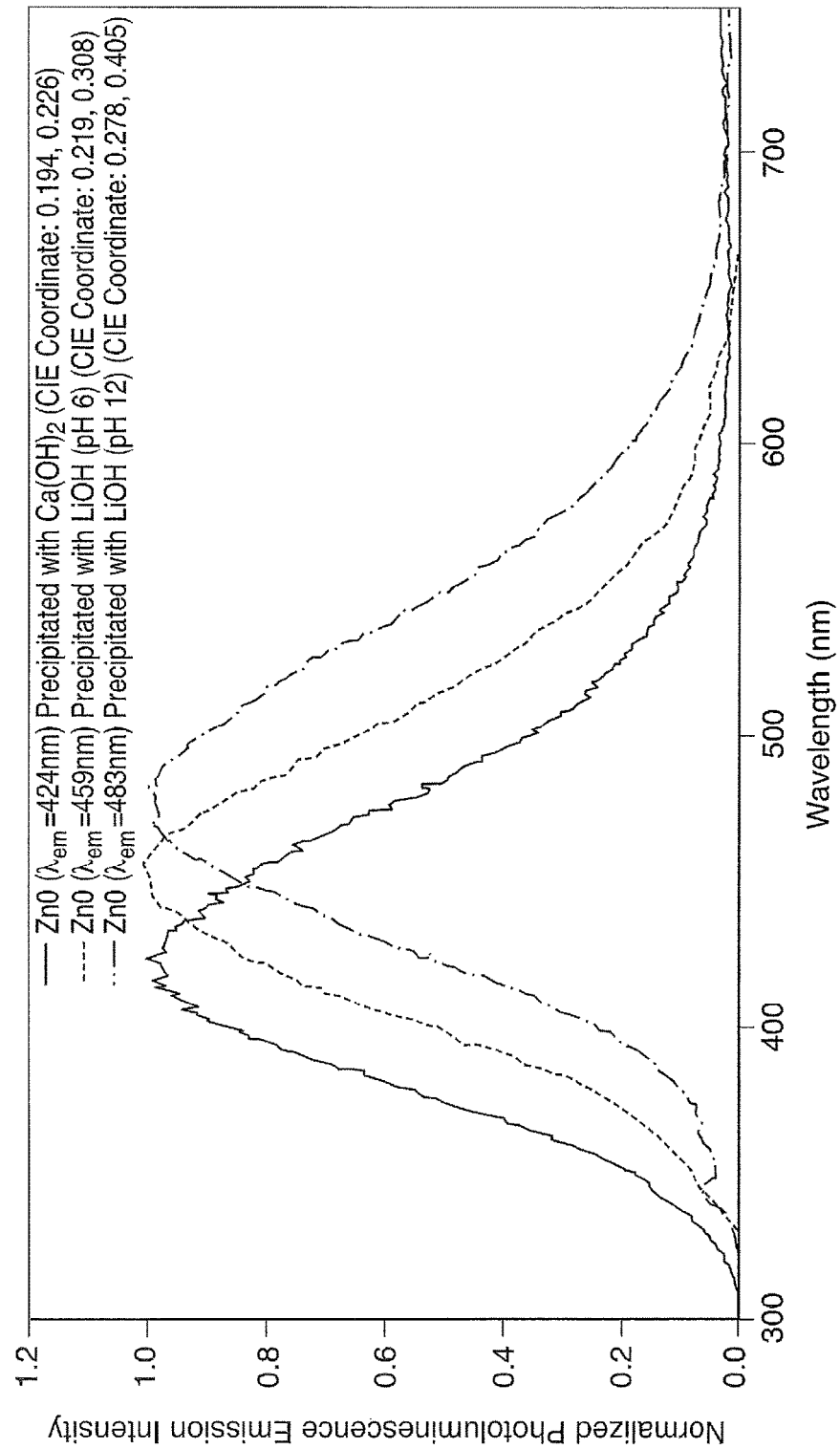
Figure 14C:
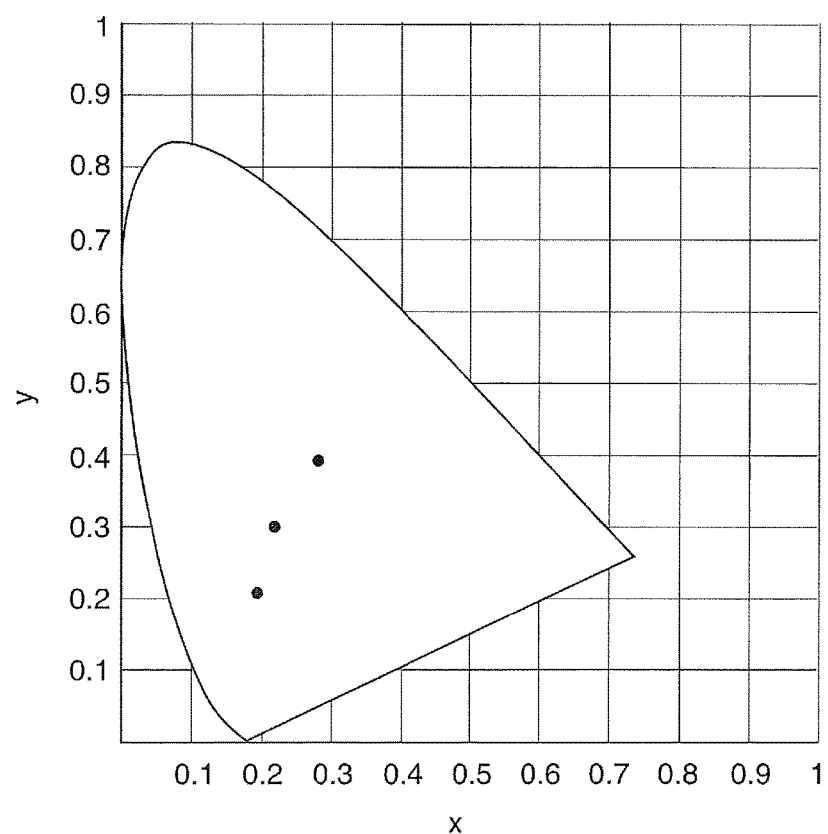
Figure 15:
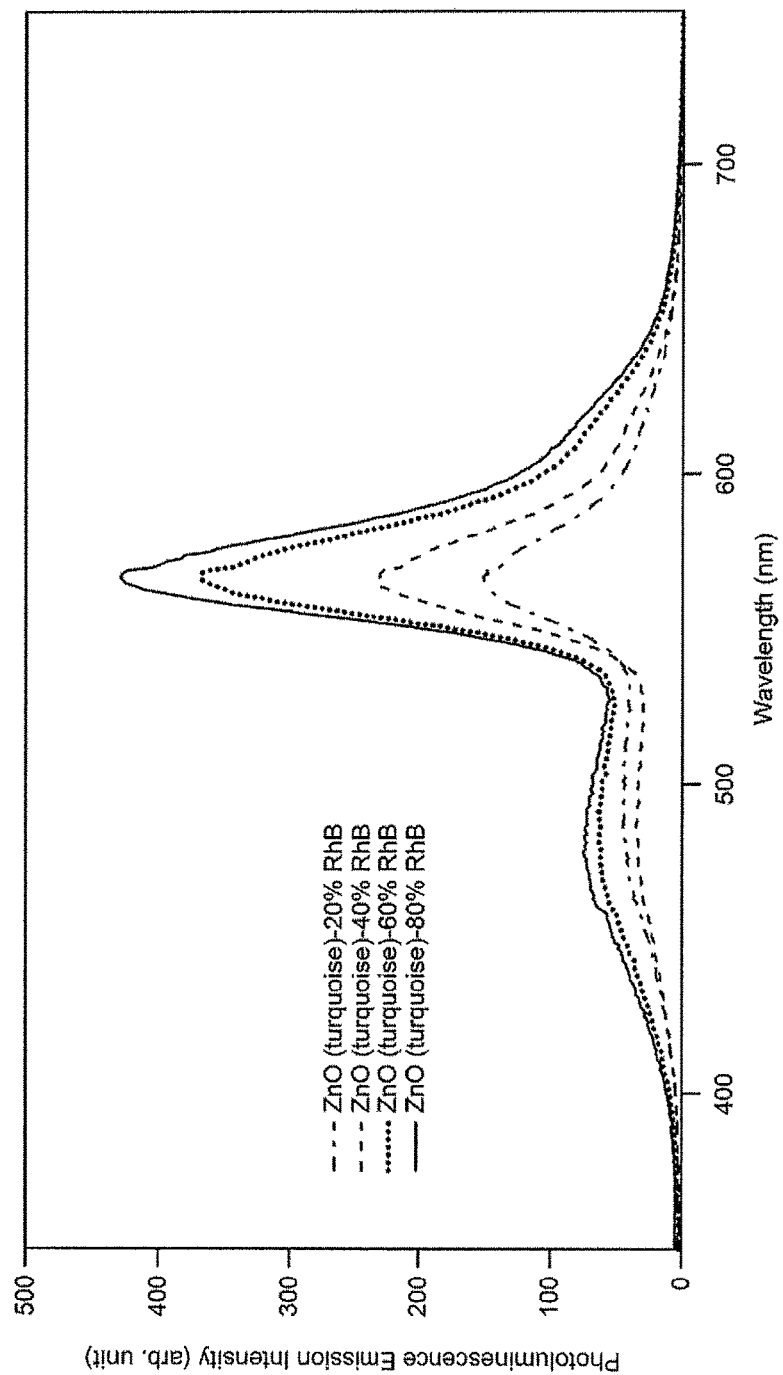
Figure 16A:
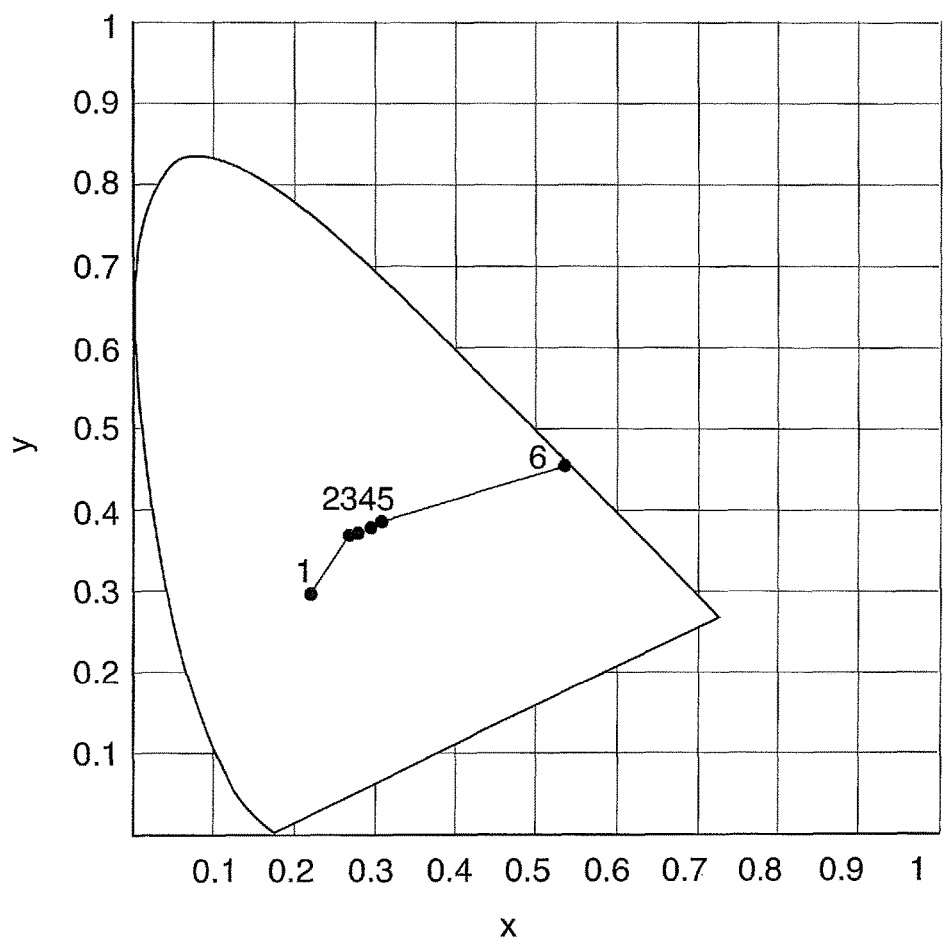
Figure 17A:
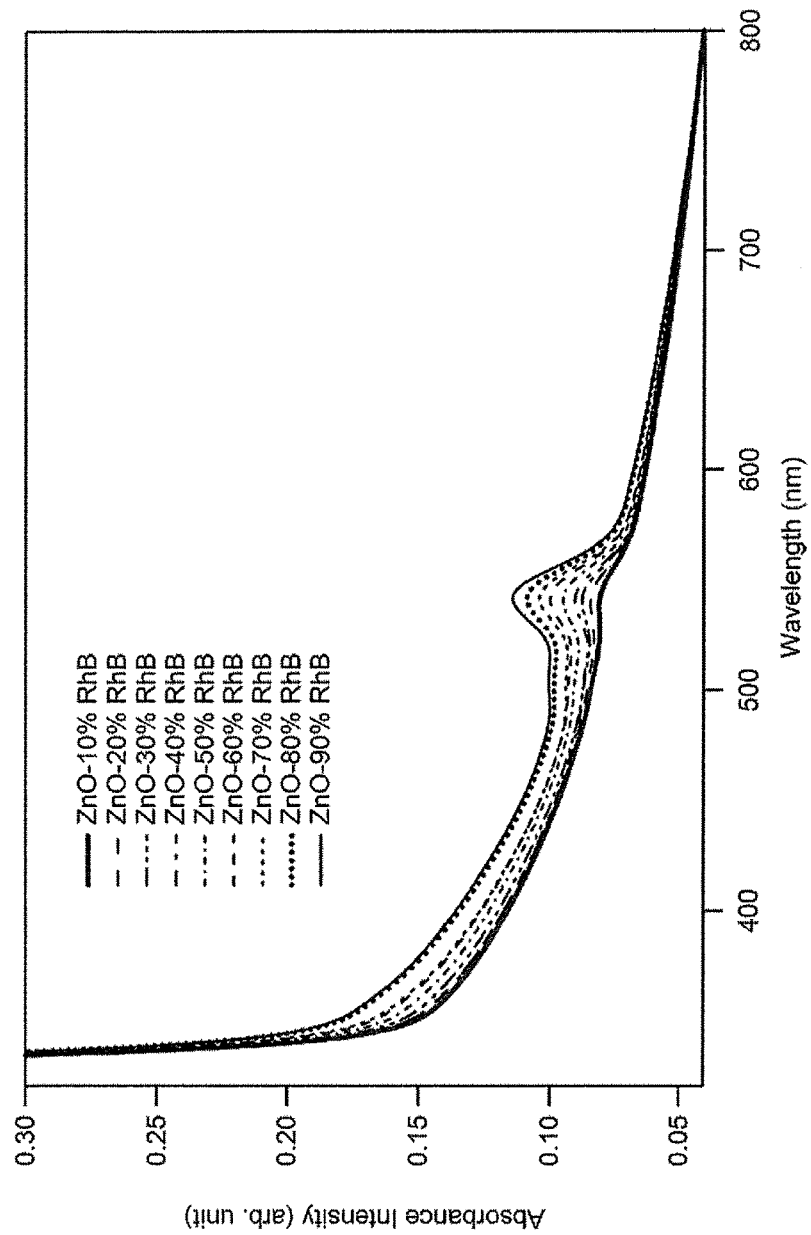
Figure 17B:
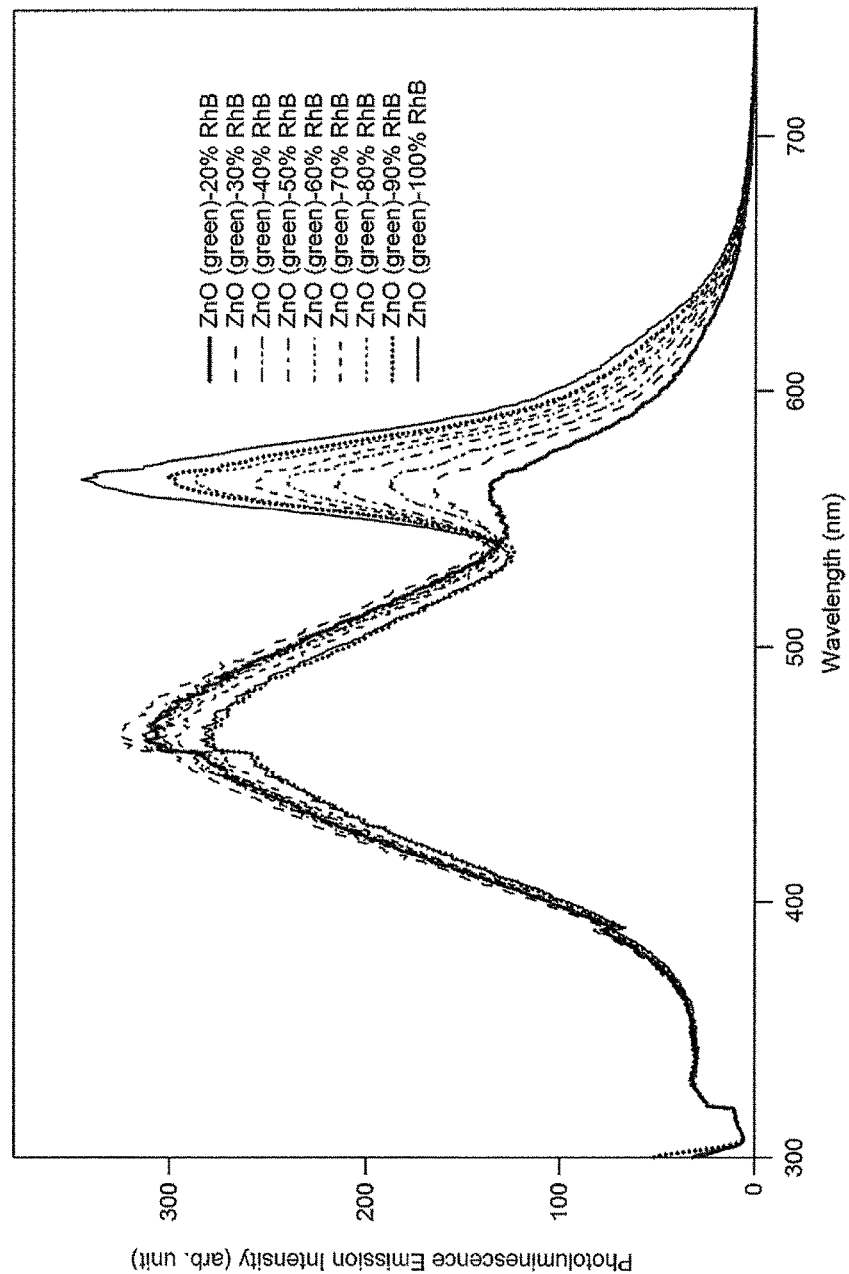
Figure 18B:
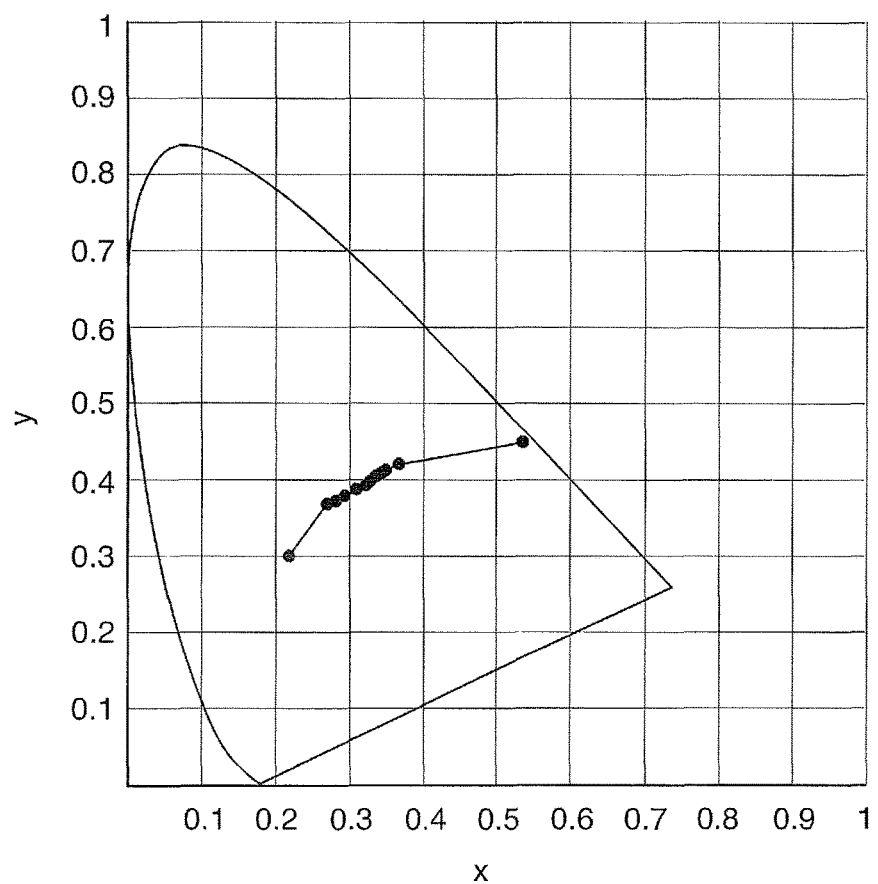

FIGS. 12A and 12B depict CIE coordinate analyses of $Ga_2O_3$—RhB nanocomposites to achieve white light emissions, with different sizes of $Ga_2O_3$, and with different amounts of RhB bound on the surface of the nanoparticles. Using linear function for modeling analysis shown in FIGS. 13A and 13B, one example of the size of $Ga_2O_3$ nanoparticles that can achieve "pure" white light is 3.8 nm. FIG. 13B shows a CIE 1931 color space chromaticity diagram indicating various color points. With increasing average number or RhB molecules per $Ga_2O_3$ nanocrystal, the perceived emission color gradually transforms from deep blue to orange-red. This color transformation can be rationally controlled with high precision and reproducibility over a wide color range. In the example of FIG. 13B, the generation of pure white light is represented by color coordinates (0.333, 0.338), using 5.73 µM RhB solution and 3.6 nm $Ga_2O_3$ nanocrystals (indicated with an arrow).

As illustrated in the above figures, the quantum yield reproducibly achieved in $Ga_2O_3$ nanocrystals may be up to 40%, which may be comparable with conventional high performance commercial blue LEDs.

It should be understood that other photoluminescent materials may be used when applying the techniques described herein. Some examples for the primary fluorophore include aluminum oxide ($Al_2O_3$), zinc oxide (ZnO) and similar metal oxides. In selecting a particular material, it can be important to consider: 1) the energy level required for excitation of the desired spectrum, 2) the cost of the material, 3) the range of solvents that can be used for production purposes (EtOH, H2O, hexane, toluene, etc.) and 4) the environmental impact of the material.

One example of a suitable alternative to $Ga_2O_3$ is zinc oxide (ZnO). Some of the advantages of ZnO include a narrower band gap (3.4 eV), the ability to disperse in polar solvents, such as EtOH and H2O, low cost, biologically consumable, and the ability to achieve higher emission color tunability (ranging from approximately 400 nm to approximately 600 nm). Regarding the narrower band gap (3.4 eV), this allows for a lower excitation energy (approximately 300 nm), generally requiring cheaper excitation LEDs.

ZnO nanoparticles may be prepared using, for example, a precipitation method. The precipitation method may include using lithium hydroxide (LiOH) as the precipitation agent in ethanol, and zinc acetate as the metal precursor. The size of nanoparticles can be tuned by precipitating at different pH. The purification process of the nanoparticles can be achieved by washing the nanoparticles with EtOH.

FIGS. 14 to 18 demonstrate the chromaticity results using a ZnO nanocrystal. FIGS. 14 to 18 illustrate results for various sizes of ZnO nanocrystals and for various concentrations of RhB.

Some adaptation of the production/synthesis techniques may be required in order to utilize ZnO as the nanocrystal. Specifically, adaptation may be needed due to lower emissions in the blue part of the spectrum. Tunability of photoluminescence for ZnO nanocrystals may be accomplished, for example, based on the preparation of the nanocrystals using a hydrolysis method. This method enables the achievement of strong blue photoluminescence, with quantum efficiency and spectral band-width comparable to that of $Ga_2O_3$ nanocrystals. White light emissions are then obtained by binding RhB to ZnO nanocrystal surfaces, based on the methods described herein. Those with skill in the art will understand that there may exist other optimization techniques. For example, it is understood that thermal and optical stability of the composite nanomaterial may be increased by varying the secondary fluorophore bound to the nanocrystal.

One example of a suitable alternative to RhB is ATTO 565. The processing techniques will generally be similar but different lighting characteristics may be provided.

Figure 19:
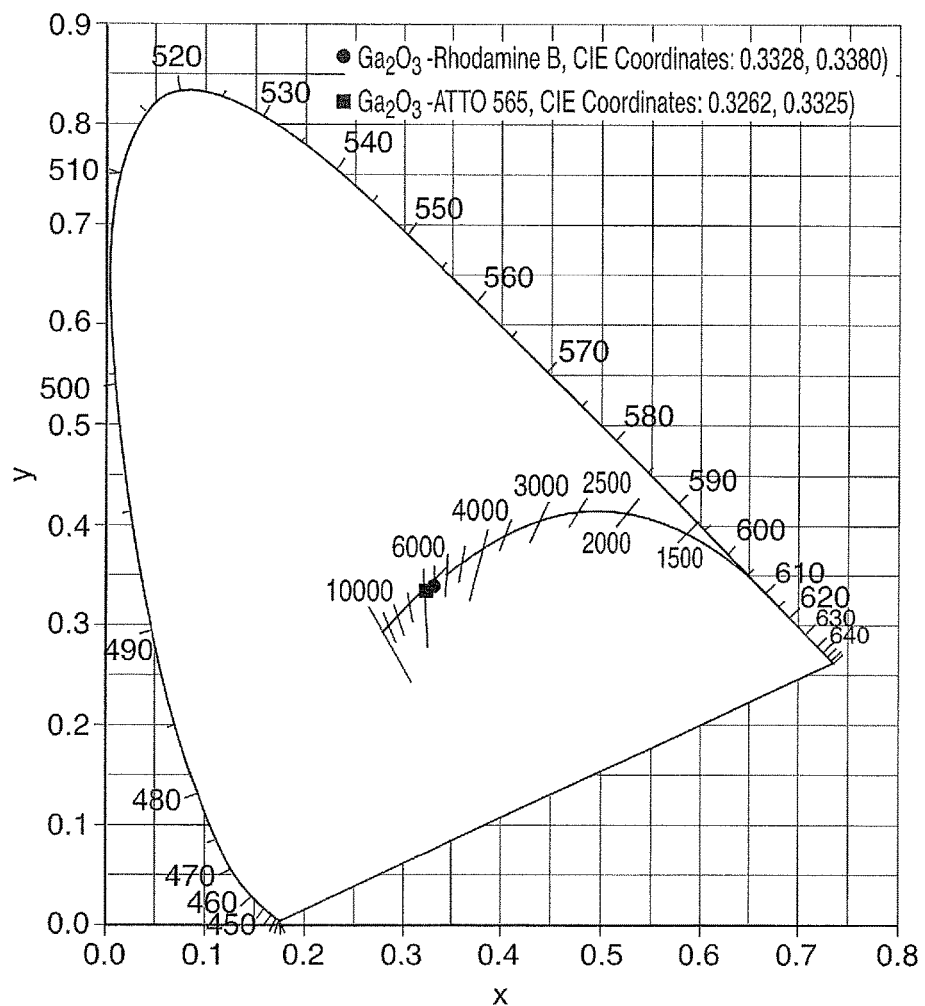
FIG. 19 illustrates a comparison of $Ga_2O_3$ (approximately 3.8 nm)—RhB and $Ga_2O_3$ (approximately 4.1 nm)—ATTO 565 "white-light" photoluminescence using a CIE chromaticity diagram, according to an embodiment.

FIG. 19 compares $Ga_2O_3$ (approximately 3.8 nm)—RhB and $Ga_2O_3$ (approximately 4.1 nm)—ATTO 565 "white-light" photoluminescence using a CIE chromaticity diagram.

Figure 20:
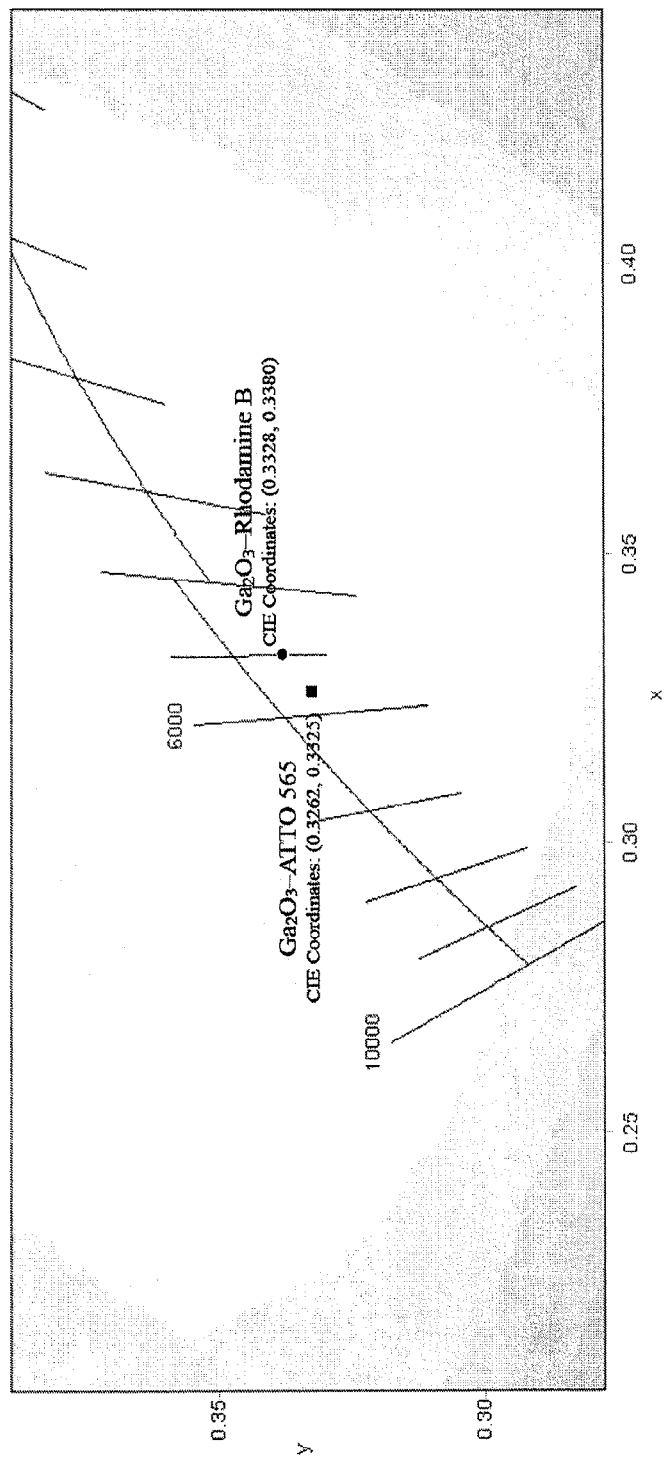
FIG. 20 illustrates a comparison of $Ga_2O_3$ (approximately 3.8 nm)—RhB and $Ga_2O_3$ (approximately 4.1 nm)—ATTO 565 photoluminescence using a CIE chromaticity diagram magnified in the white light area, according to an embodiment.

FIG. 20 compares $Ga_2O_3$ (approximately 3.8 nm)—RhB and $Ga_2O_3$ (approximately 4.1 nm)—ATTO 565 photoluminescence using CIE chromaticity diagram magnified in the white light area.

Figure 21:
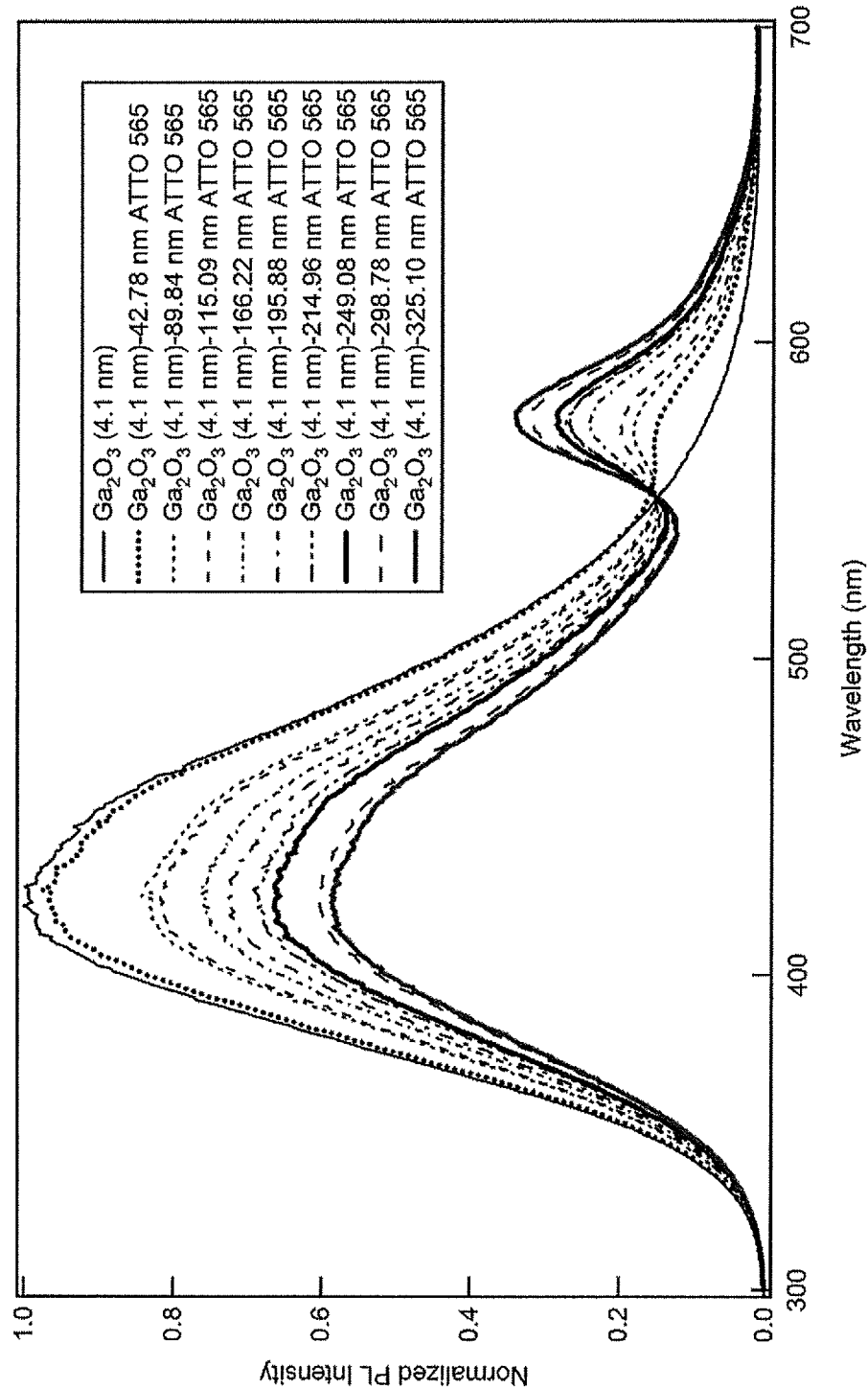
FIG. 21 illustrates the photoluminescence spectra of $Ga_2O_3$ (approximately 4.1 nm)—ATTO 565, according to an embodiment.

FIG. 21 illustrates the photoluminescence spectra for $Ga_2O_3$ (approximately 4.1 nm)—ATTO 565. The solid line indicates the spectrum corresponding to white light.

Figure 22:
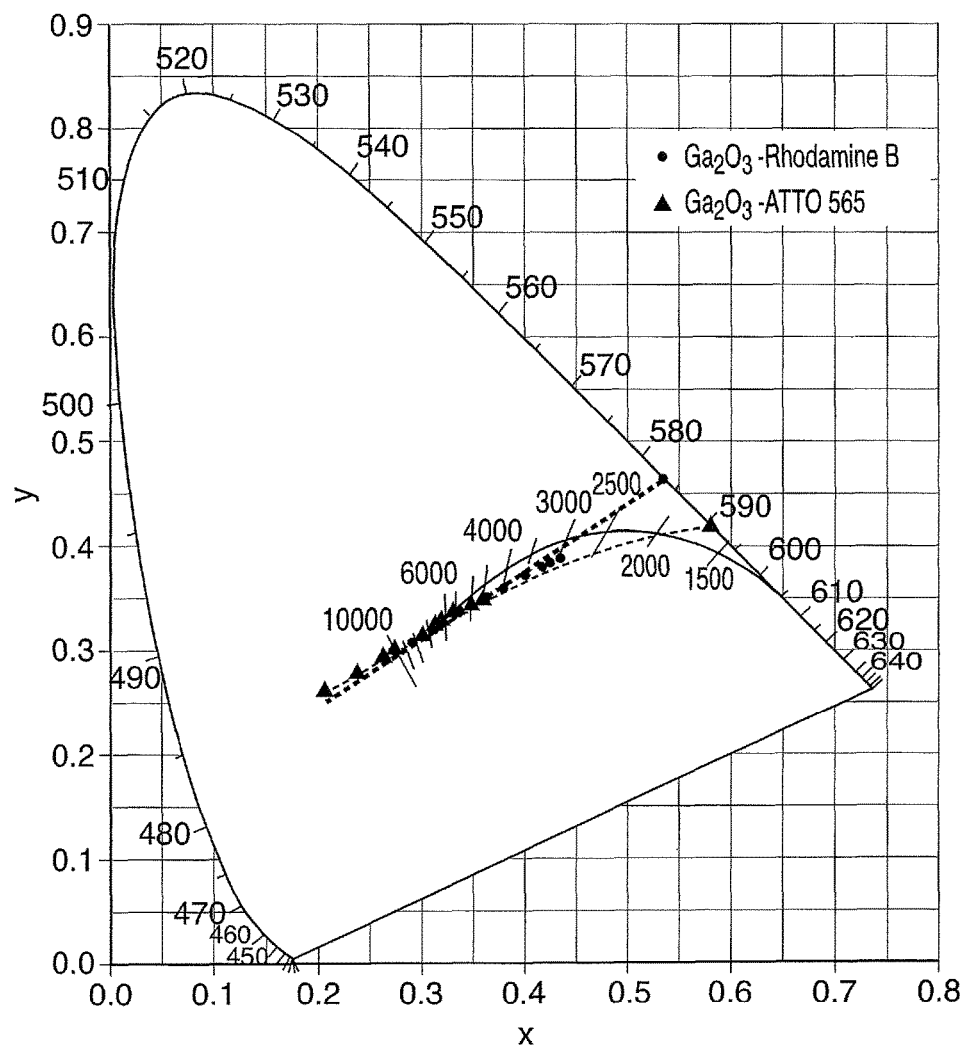
FIG. 22 illustrates a comparison of $Ga_2O_3$ (approximately 3.8 nm)—RhB and $Ga_2O_3$ (approximately 4.1 nm)—ATTO 565 with different concentrations of secondary fluorophores using a CIE chromaticity diagram, according to an embodiment.

FIG. 22 compares $Ga_2O_3$ (approximately 3.8 nm)—RhB and $Ga_2O_3$ (approximately 4.1 nm)—ATTO 565 with different concentrations of secondary fluorophores using a further CIE chromaticity diagram.

Figure 23:
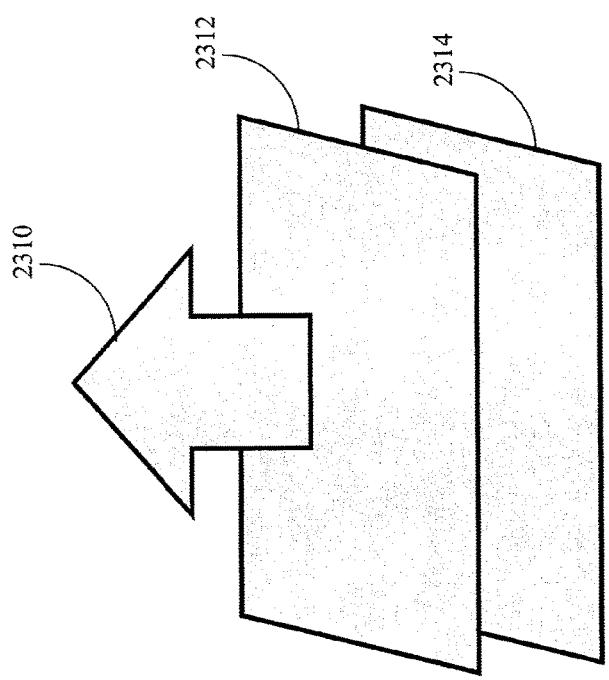
FIG. 23 is a block diagram of a hybrid nanomaterial LED, according to an embodiment.

FIG. 23 illustrates a hybrid nanomaterial LED according to an embodiment. An ultraviolet LED layer 2314 is coated with a layer of hybrid nanomaterial 2312 in order to produce white light 2310.

Figure 24A:
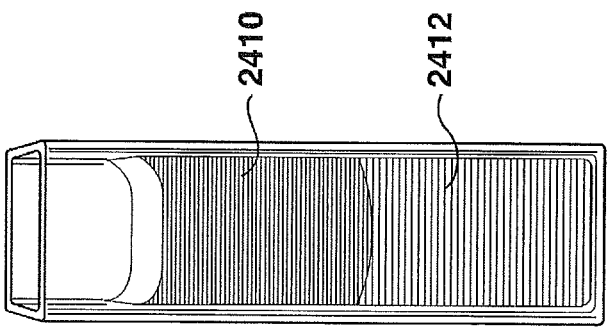
FIGS. 24A to 24C are exemplary photographs of $Ga_2O_3$ nanocrystals in hexane in contact with RhB, in water, during sample preparation, according to an embodiment.
Figure 24B:
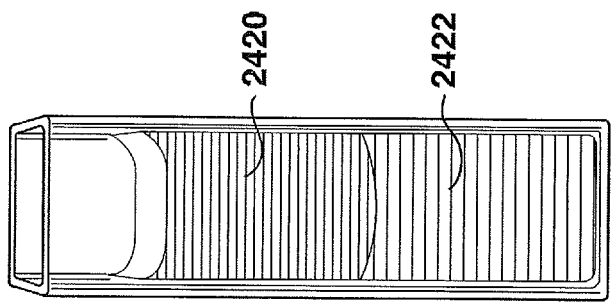
Figure 24C:
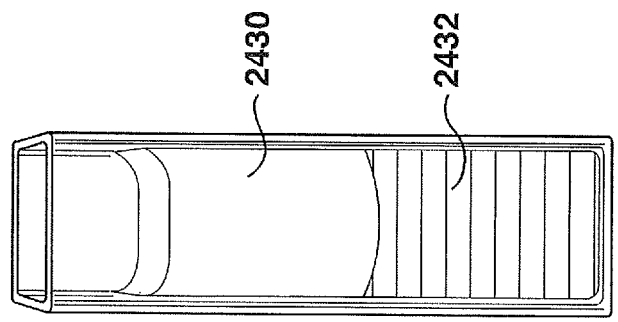

FIGS. 24A to 24C are exemplary photographs of $Ga_2O_3$ nanocrystals in hexane, the top layer, in contact with RhB in water, the bottom layer, during sample preparation. FIGS. 24A to 24C show the change of color over time by transport and binding of RhB to $Ga_2O_3$ nanocrystal surfaces. It shows that a decrease in the emission intensity of RhB in water and the transformation of the $Ga_2O_3$ nanocrystal luminescence from blue to white upon excitation with a ultraviolet light suggest conjugation of nanocrystals with RhB. FIG. 24A has a top layer 2410 that is approximately dark blue and a bottom layer 2412 that is approximately orange. FIG. 24B has a top layer 2420 that is approximately light blue and a bottom layer 2422 that is approximately yellow. FIG. 24C has a top layer 2430 that is approximately white and a bottom layer 2432 that is approximately light yellow.

The hybrid nanomaterial of this disclosure is intended to provide a low cost material that produces pure white light. Additionally, the hybrid nanomaterial is believed to be tunable such that it can produce any other color in the visible and non-visible spectrum.

The hybrid nanomaterial can be processed into light emitting structures and devices from a liquid form, i.e. solution, or a solid form, i.e. powder.

Because of the versatility and chemical compatibility of the hybrid nanomaterial, it can be used in various configurations and devices. Such devices include, for example, LEDs, light emitting displays, luminescent liquids and polymer/plastic panels. Further examples of devices that may be using the nanomaterials of the present invention are provided herewith.

LED use in television displays typically require specific color output from the LEDs that comprise the backlighting of the display. The hybrid nanocrystal described herein enables the fabrication of LEDs with particular luminescent attributes by means of the specific color tunability. Additionally, the ability to create a pure white light backlighting of a display allows for increased realized or perceived fidelity of color representation.

The hybrid nanomaterial described herein is intended to enable the achievement of internal quantum yield that is comparable to currently used blue LEDs, but with a higher white conversion efficiency of up to 20% in comparison to prior art technologies.

LEDs synthesized using an embodiment described herein are intended to be less expensive than traditional LEDs because the material used in the coatings is typically more than ten times less expensive. For example, silicon or indium tin oxides (ITO), both abundant and inexpensive materials, may be used as a substrate instead of conventional materials, such as sapphire, which are expensive and rare. For example, a standard blue LED precursor according to conventional systems, for example trimethylgallium 25 g, costs approximately $2000. While a possible blue LED precursor according to the present disclosure, for example, gallium acetylacetonate 25 g or zinc nitrate 25 g, costs approximately $140 and $1.25 respectively.

The nanomaterial of the present disclosure may be produced using conventional solid state manufacturing methods, which can be accomplished at relatively low costs. Additionally, the hybrid nanomaterial can also be produced in solution. This contrasts with conventional approaches, which typically have solid state only manufacturing processes. As a liquid solution, the hybrid nanomaterial may be applied, for example, by spraying or printing thus enabling useful lighting applications that would generally not have been possible in accordance with conventional solutions. For example, it may be possible to convert curtains or blinds into a light source. As well, it may be more easy to produce a light source in a unique, curved shape.

The colloidal suspensions of RhB-conjugated nanocrystals are completely transparent, potentially allowing for their incorporation into transparent polymers, flexible films, and optical windows. The integration of the hybrid nanophosphor into an LED can be achieved by coating a thin layer of colloidal suspension on flat top LED window. Such a thin transparent layer generates a bright white illumination, which is sufficiently strong to be visible even in day light. The internal relative quantum yield of this material may be up to approximately 30%, and can be further improved primarily through an increase in the oxygen vacancy concentration in $Ga_2O_3$ nanocrystals by identifying optimal reducing agents in nanocrystal synthesis, and the selection of secondary chromophore with maximum emission efficiency in the nanocrystal surface-bound form. An advantage of the transparency of the nanomaterial and the ease with which it can be processed in different structures and devices, is that it has applications for new integrated lighting technologies. For example, multifunctional windows which are transparent during the day but illuminate light at night.

A particular advantage of embodiments of the hybrid nanomaterial synthesis method described herein is that the fabrication methods are relatively low cost. The hybrid nanomaterials are relatively simple to produce, their features including luminescence are highly tunable, and their luminescence features have attractive functionality attributes.

Conventional approaches that use multiple fluorophores typically have re-absorption by the light emitting nanomaterials. In contrast, with hybrid nanomaterials, this re-absorption is eliminated.

The methods described herein enable preparation and processing of light emitting structures including the white light emitting hybrid nanomaterial, from a liquid form, i.e., solution or from a solid form, i.e., powder. This makes the technology highly adaptable to different fabrication methods and infrastructures. This adaptability makes the hybrid nanomaterial highly scalable and versatile, and also easy and inexpensive to apply in relation to existing processes and fabrication infrastructures. As well, its chemical compatibility enables use in connection with a large number of configurations and devices, for example, LEDs, light emitting displays, luminescent liquids, or polymer/plastic panels.

The light emitting structures fabricated using the hybrid nanomaterials are highly tunable to consumer preference. For example, some consumers prefer "pure white light" while others prefer a "more yellow white", sometimes called a "warm white light". Many consumers, for example, complain about the appearance or eye comfort of emerging non-incandescent light sources. The flexibility of hybrid nanomaterials enables the tuning of features based on adjusting of the characteristics during synthesis, such as nanocrystal size and the choice and concentration of the nanocrystal bound fluorophores. Adjusting these characteristics can in turn vary the quality of light, such as producing a pure white light or a warm white light.

The embodiments of the production/synthesis method described herein are intended to enable a manufacturer to use the same or similar manufacturing infrastructure and the same or similar processes at a high level. As such, a manufacturer can manufacture different products with different attributes addressing variation in consumer or business preference. As well, the method of synthesis described herein typically requires fewer manufacturing steps than prior art methods. Also, the synthesis method enables solution-based fabrication (i.e. liquid phase) which is intended to provide for new lighting applications, and more cost effective fabrication of light emitting structures, based on custom requirements.

A further advantage is that the hybrid material acts as a single illumination entity, avoiding the need for multiple phosphors or LEDs to approximate white light. Another advantage is that the light emitting structures are compatible with outdoor and large-space lighting technologies relying on high-energy UV excitation.

Figure 25:
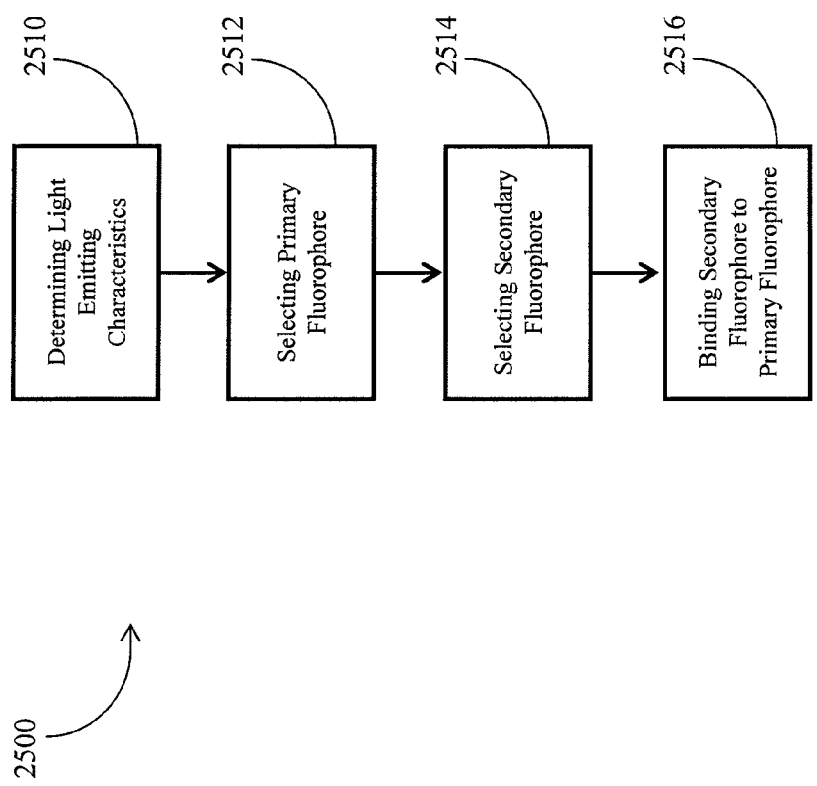
FIG. 25 is a flowchart for a method of producing a light emitting structure, according to an embodiment.

FIG. 25 is a flowchart for a method 2500 of producing a light emitting structure according to an embodiment. The light emitting characteristics of the light emitting structure are determined 2510. A primary fluorophore is selected 2512 with properties such that the photoluminescence is in a predetermined spectrum. A secondary fluorophore is also selected 2514 with properties such that the photoluminescence is in another predetermined spectrum with an absorption spectrum that overlaps with the first predetermined spectrum. The secondary fluorophore is bound 2516 to the primary fluorophore such that nonradiative dipole-dipole coupling occurs in such a way that the selected light emitting characteristics are provided.

In a further case, the light emitting characteristics are configured by varying at least one of the size of the primary fluorophore, the distance between the secondary fluorophore and the primary fluorophore, and the emission spectrum overlap between the secondary fluorophore and the primary fluorophore. The light emitting characteristics may be selected such that the light emissions are in the white light range.

In another case, the binding of the primary and secondary fluorophores occurs in a liquid phase. In a further case, the binding may be the result of interactions of a functional group in order to provide a nanomaterial structure that is operable to define a single illuminating entity which itself is operable upon application of a single excitation energy to generate light emissions consistent with the selected light emission characteristics.

Figure 26:
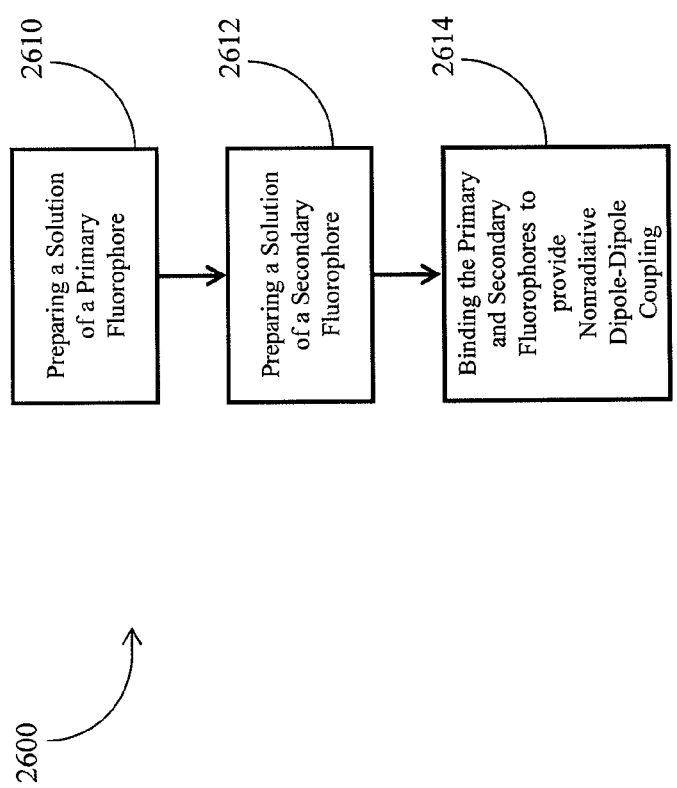
FIG. 26 is a flowchart for a method of producing a light emitting structure using a solution, according to an embodiment.

FIG. 26 is a flowchart for a method 2600 of producing a light emitting structure according to an embodiment. A solution of a primary fluorophore is prepared 2610. A solution of a secondary fluorophore is also prepared 2612. The primary fluorophore solution is contacted with the secondary fluorophore solution such that the primary fluorophore and secondary fluorophore bind to provide nonradiative dipole-dipole coupling 2614.

In a further embodiment, in order to increase the stability and operational life time of the LED, the LED may be comprised of all inorganic light emitting hybrid nanomaterials. Inorganic compounds are generally less sensitive than organic molecules to photodegradation and other environmental effects such as temperature and moisture. A fully inorganic hybrid nanomaterial can be synthesized by binding semiconductor quantum dots, which emit light in the orange to red range, to oxide nanocrystals, which emit light in the blue range. Examples of quantum dots include CdSe or CdTe. Examples of oxide nanocrystals include $Ga_2O_3$ and ZnO. The all inorganic white LEDs can be formed through indirect binding as described above. In this embodiment, the red emission arising from the quantum dot can be tuned by changing the size of the nanocrystal, and in turn, provide for the emission of pure white light.

In a further case, the method of synthesis of the hybrid nanomaterials is applicable to a multitude of fluorophore systems that emit in the green to red region of the visible spectrum (550-650 nm), allowing for a broad selection of material components. For example, the fluorophore layer on the nanoparticles could include Xanthene dyes (Rhodamine, Fluorescein, and Eosin derivatives), ATTO dyes (ATTO 565, ATTO 590), nanocrystal quantum dots (i.e. CdSe, CdTe), and the like.

All terms used herein are used in accordance with their ordinary meanings unless the context or definition clearly indicates otherwise. Also, unless indicated otherwise except within the claims the use of "or" includes "and" and vice-versa. Non-limiting terms are not to be construed as limiting unless expressly stated or the context clearly indicates otherwise (for example, "including", "having", "characterized by" and "comprising" typically indicate "including without limitation"). Singular forms included in the claims such as "a", "an" and "the" include the plural reference unless expressly stated or the context clearly indicates otherwise. Further, it will be appreciated by those skilled in the art that other variations of the preferred embodiments described may also be practiced without departing from the scope of the claims.

In the preceding description, for purposes of explanation, numerous details are set forth in order to provide a thorough understanding of the embodiments. However, it will be apparent to one skilled in the art that these specific details are not required.

The above-described embodiments are intended to be examples only. Alterations, modifications and variations can be effected to the particular embodiments by those of skill in the art without departing from the scope, which is defined solely by the claims appended hereto.

The invention claimed is:

1. A light emitting structure comprising:
    a primary fluorophore having a first predetermined photoluminescence spectrum; and
    a secondary fluorophore having a second predetermined photoluminescence spectrum and an absorption spectrum that overlaps with the first predetermined spectrum,
wherein the secondary fluorophore is bound with the primary fluorophore such that nonradiative dipole-dipole coupling occurs and wherein the primary fluorophore and secondary fluorophore are selected such that the combination of first predetermined spectrum and second predetermined spectrum provides light emissions in the white light range.

2. The light emitting structure of claim 1, wherein the primary fluorophore is a metal oxide nanocrystal.

3. The light emitting structure of claim 2, wherein the metal oxide is selected from the group consisting of: γ-gallium(III) oxide, zinc oxide and aluminium(III) oxide.

4. The light emitting structure of claim 1, wherein the secondary fluorophore is selected from the group consisting of: fluorescent dyes, polymers and quantum dots.

5. The light emitting structure of claim 4, wherein the fluorescent dye is Rhodamine B and the primary fluorophore is selected from the group consisting of: γ-gallium(III) oxide and zinc oxide.

6. The light emitting structure of claim 1, wherein the primary fluorophore is γ-gallium(III) oxide and emits light having a broad spectrum with the maximum in a range of 405 to 465 nanometers.

7. The light emitting structure of claim 6, wherein the secondary fluorophore emits light having a broad spectrum with the maximum in a range of 550 to 650 nanometers.

8. The light emitting structure of claim 1, wherein the nonradiative dipole-dipole coupling is Förster Resonance Energy Transfer (FRET).

9. The light emitting structure of claim 1, wherein the selecting comprises varying at least one of:
    size of the primary fluorophore,
    concentration of the secondary fluorophore bonded to the primary fluorophore, which impacts the average distance between the primary fluorophore and the secondary fluorophore, type of secondary fluorophore, and
emission spectrum overlap between the primary fluorophore and the secondary fluorophore.

10. The light emitting structure of claim 2, wherein the secondary fluorophore is bound to the primary fluorophore by metal-binding functional groups.

11. The light emitting structure of claim 1, wherein the secondary fluorophore is indirectly bound to the primary fluorophore by a bonding agent or by encapsulating the primary and secondary fluorophores in a nanoparticle such that the primary fluorophore and secondary fluorophore achieve the non-radiative dipole-dipole coupling.

12. A method of producing a light emitting structure, the method comprising:
    determining selected light emitting characteristics comprising light emissions in the white light range;
    selecting:
        a primary fluorophore having a first predetermined photoluminescence spectrum, and
        a secondary fluorophore having a second predetermined photoluminescence spectrum and an absorption spectrum that overlaps with the first predetermined spectrum based on the selected light emitting characteristics; and
    binding the secondary fluorophore to the primary fluorophore such that nonradiative dipole-dipole coupling occurs in such a way that the selected light emitting characteristics are provided.

13. The method of claim 12, wherein the selecting the primary flurorphore and the secondary fluorophore to provide the determined selected light emitting characteristics comprises by varying at least one of:
    the size of the primary fluorophore,
    the distance between the secondary fluorophore and the primary fluorophore, and
    the emission spectrum overlap between the secondary fluorophore and the primary fluorophore.

14. The method of claim 12, wherein the binding occurs in a liquid phase.

15. The method of claim 12, wherein the primary fluorophore is a metal oxide nanocrystal and the binding comprises interactions of a metal-binding functional group from the secondary flurophore to the primary fluorophore to provide a nanomaterial structure that is operable to define a single illuminating entity operable upon application of a single excitation energy to generate light emissions consistent with the light emission characteristics.

16. A light emitting structure comprising:
    a primary fluorophore having a first predetermined photoluminescence spectrum, wherein the primary flurophore is a metal oxide nanocrystal; and
    a secondary fluorophore having a second predetermined photoluminescence spectrum and an absorption spectrum that overlaps with the first predetermined spectrum wherein the secondary fluorophore is bound to the primary fluorophore by metal-binding functional groups,
    wherein the secondary fluorophore is bound with the primary fluorophore such that nonradiative dipole-dipole coupling occurs.

17. The light emitting structure of claim 16, wherein the metal oxide is selected from the group consisting of: γ-gallium(III) oxide, zinc oxide and aluminium(III) oxide.

18. The light emitting structure of claim 16, wherein the secondary fluorophore is selected from the group consisting of: fluorescent dyes, polymers and quantum dots.

19. The light emitting structure of claim 16, wherein the primary fluorophore is γ-gallium(III) oxide and emits light having a broad spectrum with the maximum in a range of 405 to 465 nanometers.

20. The light emitting structure of claim 19, wherein the secondary fluorophore emits light having a broad spectrum with the maximum in a range of 550 to 650 nanometers.

* * * * *